(12) United States Patent
Fukami et al.

(10) Patent No.: US 8,154,913 B2
(45) Date of Patent: Apr. 10, 2012

(54) MAGNETORESISTANCE EFFECT ELEMENT AND MAGNETIC RANDOM ACCESS MEMORY

(75) Inventors: Shunsuke Fukami, Tokyo (JP); Nobuyuki Ishiwata, Tokyo (JP); Tetsuhiro Suzuki, Tokyo (JP); Norikazu Ohshima, Tokyo (JP); Kiyokazu Nagahara, Tokyo (JP)

(73) Assignee: NEC Corporation, Tokyo (JP)

( * ) Notice: Subject to any disclaimer, the term of this patent is extended or adjusted under 35 U.S.C. 154(b) by 169 days.

(21) Appl. No.: 12/739,855

(22) PCT Filed: Aug. 21, 2008

(86) PCT No.: PCT/JP2008/064891
§ 371 (c)(1),
(2), (4) Date: Apr. 26, 2010

(87) PCT Pub. No.: WO2009/054180
PCT Pub. Date: Apr. 30, 2009

(65) Prior Publication Data
US 2010/0254183 A1    Oct. 7, 2010

(30) Foreign Application Priority Data
Oct. 25, 2007  (JP) ................................. 2007-277519

(51) Int. Cl.
G11C 11/00  (2006.01)
(52) U.S. Cl. ......... 365/158; 365/100; 365/148; 365/171
(58) Field of Classification Search .................. 365/158, 365/100, 148, 171
See application file for complete search history.

(56) References Cited

U.S. PATENT DOCUMENTS

| | | | |
|---|---|---|---|
| 5,650,887 A * | 7/1997 | Dovek et al. ................. | 360/75 |
| 6,580,270 B1 * | 6/2003 | Coehoorn ..................... | 324/252 |
| 6,798,690 B1 * | 9/2004 | Katti ............................. | 365/158 |
| 7,193,892 B2 * | 3/2007 | Katti ............................. | 365/173 |
| 7,633,694 B2 * | 12/2009 | Alex et al. ..................... | 360/31 |

FOREIGN PATENT DOCUMENTS

JP    2005-116888 A    4/2005
JP    2007-142364 A    6/2007

OTHER PUBLICATIONS

International Search Report for PCT/JP2008/064891, mailed Oct. 7, 2008.
J. Hayakawa et al., "Effect of High Annealing Temperature on Giant Tunnel Magnetoresistance Ratio of CoFeB/MgO/CoFeB Magnetic Tunnel Junctions", Applied Physics Letters, vol. 89, p. 232510, 2006.
A. Kent et al., "Spin-transfer-induced Precessional Magnetization Reversal", Applied Physics Letters, vol. 84, No. 19, pp. 3897-3899, 2004.

* cited by examiner

Primary Examiner — Pho M Luu

(57) ABSTRACT

A magnetoresistance effect element comprising: a first magnetization fixed layer whose magnetization direction is fixed; a first magnetization free layer whose magnetization direction is variable; a first nonmagnetic layer sandwiched between the first magnetization fixed layer and the first magnetization free layer; a second magnetization fixed layer whose magnetization direction is fixed; a second magnetization free layer whose magnetization direction is variable; and a second nonmagnetic layer sandwiched between the second magnetization fixed layer and the second magnetization free layer. The first magnetization fixed layer and the first magnetization free layer have perpendicular magnetic anisotropy, while the second magnetization fixed layer and the second magnetization free layer have in-plane magnetic anisotropy. The first magnetization free layer and the second magnetization free layer are magnetically coupled to each other. In a plane parallel to each layer, center of the second magnetization free layer is displaced from center of the first magnetization free layer.

20 Claims, 31 Drawing Sheets

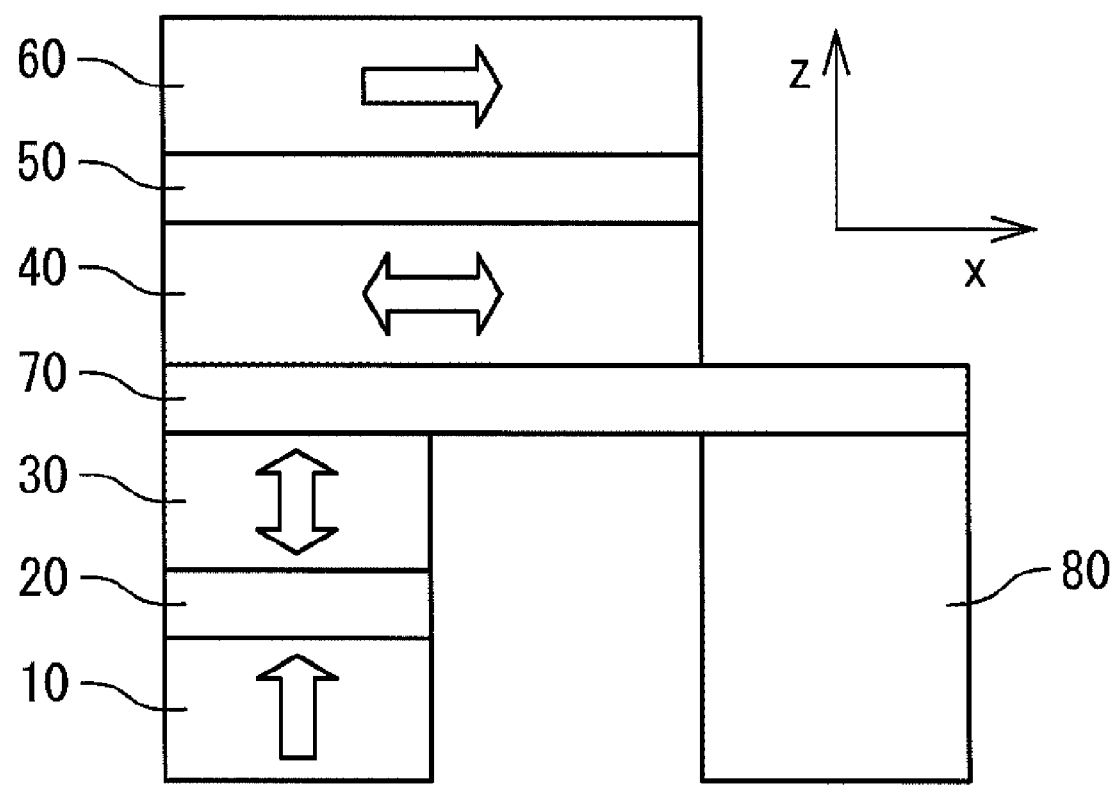

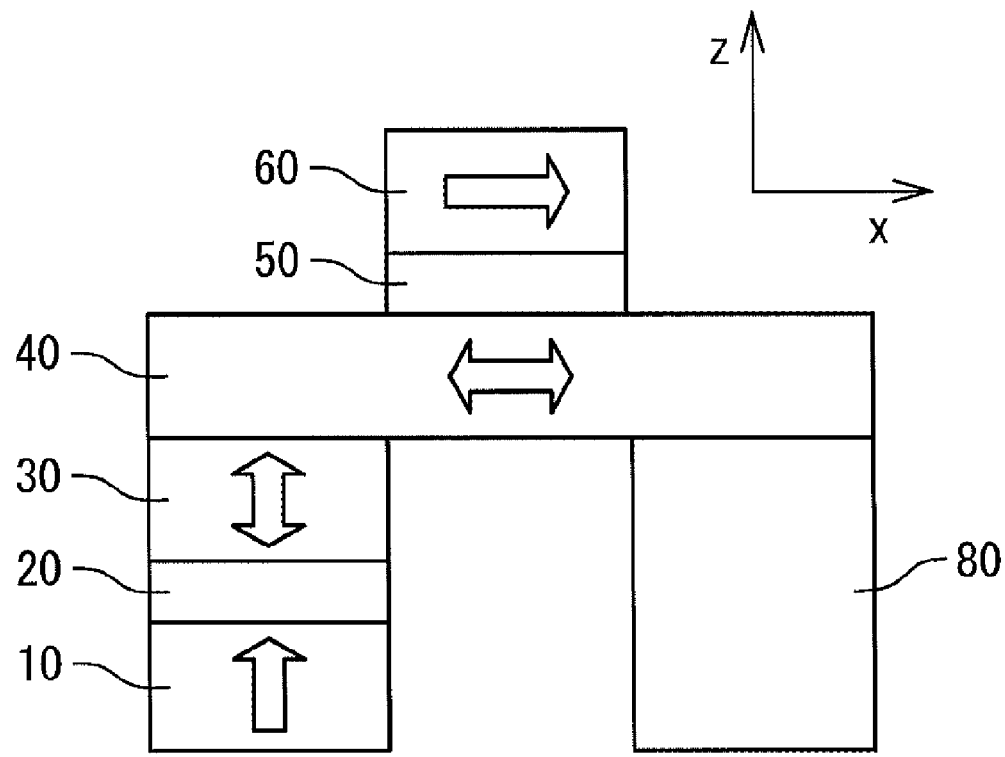

MAGNETORESISTANCE EFFECT ELEMENT AND MAGNETIC RANDOM ACCESS MEMORY

TECHNICAL FIELD

The present invention relates to a magnetoresistance effect element and a magnetic random access memory. In particular, the present invention relates to a magnetoresistance effect element and a magnetic random access memory based on spin transfer magnetization switching method.

BACKGROUND ART

A magnetic random access memory (MRAM) is a nonvolatile random access memory that utilizes a magnetoresistance effect element such as a magnetic tunnel junction (MTJ) element as a memory element. Since the MRAM is capable of achieving high-speed operation and can have infinite rewrite tolerance, research and development of the MRAM have been actively carried out to achieve commercialization in recent years. To further improve the versatility of the MRAM hereafter requires reduction in a write current and increase in a read-out signal. The reason is that the reduction in the write current not only lowers operation power consumption but also reduces costs due to reduction in a chip area, and the increase in the read-out signal shortens a read time which enables higher-speed operation.

As a write method for reducing the write current, the following spin transfer magnetization switching method has been proposed. Let us consider, for example, a memory element in which a first magnetic layer having reversible magnetization, a nonmagnetic layer and a second magnetic layer whose magnetization direction is fixed are stacked. According to the spin transfer magnetization switching method, a write current is supplied between the second magnetic layer and the first magnetic layer, and interaction between spin-polarized conduction electrons of the write current and local electrons in the first magnetic layer causes switching of the magnetization of the first magnetic layer. To directly supply the current in the memory element at the time of data writing is one of major differences as compared with a typical write method; a magnetic field application method (a method that supplies a write current to an interconnection arranged near the memory element and applies a resultant magnetic field to switch the magnetization of the first magnetic layer). Moreover, in the case of the spin transfer magnetization switching method, the magnetization switching (writing) is caused when current density excesses a certain threshold value. Since the current density is increased as a cell size is reduced, the write current can be made smaller with miniaturization. That is, scaling property of the write current is improved. Japanese Patent Publication JP-2007-142364 (hereinafter referred to as "Patent Document No. 1") discloses material characteristics which can make the threshold current density for the magnetization switching equal to or less than a desired value. According to it, it is possible to reduce the threshold current density by using a perpendicular magnetization film as a magnetic layer and adjusting magnetic anisotropy energy density Ku and saturation magnetization Ms as appropriate.

Whereas, to increase a magnetoresistance ratio (MR ratio) of the magnetoresistance effect element is most effective for increasing the read-out signal. Development of an MTJ element that exhibits a high magnetoresistance ratio has been actively performed in recent years. Hayakawa et al., "Effect of high annealing temperature on giant tunnel magnetoresistance ratio of CoFeB/MgO/CoFeB magnetic tunnel junctions", APPLIED PHYSICS LETTERS, Vol. 89, p. 232510, 2006 (hereinafter referred to as Non-patent Document No. 1) reports that a giant MR ratio (about 500% at room temperature) can be obtained in the Co—Fe—B/Mg—O/Co—Fe—B MTJ. The reasons that such a high MR ratio can be obtained in the Co—Fe—B/Mg—O/Co—Fe—B MTJ are considered to be as follows: (1) Co—Fe—B has high spin polarization, (2) (001)-oriented polycrystalline MgO that exhibits high spin filtering effect is formed by annealing Mg—O sandwiched between amorphous Co—Fe—B at high temperature.

DISCLOSURE OF INVENTION

The inventors of the present application have recognized the following points. In the case of the spin transfer magnetization switching method, as described above, a perpendicular magnetization film whose material characteristics are adjusted as appropriate can be used as a magnetic layer in order to reduce the write threshold current density and hence reduce the write current of the MRAM. Whereas, an MTJ consisting of a magnetic layer having high spin polarization and an insulating layer exhibiting high spin filtering effect can be used in order to increase the MR ratio and hence increase the read-out signal of the MRAM.

However, when the perpendicular magnetization film having appropriate material characteristics is used as the magnetic layer for reducing the write threshold current density, it is difficult to develop an MTJ exhibiting a high MR ratio. The above-mentioned Patent Document No. 1 describes that the saturation magnetization being smaller is a preferable material characteristic of the perpendicular magnetization film. Whereas, the spin polarization of a magnetic layer generally becomes higher as the saturation magnetization is larger and becomes lower as the saturation magnetization is smaller. Therefore, high spin polarization cannot be obtained by the material characteristic preferable for the perpendicular magnetization film, which makes it difficult to improve the MR ratio. That is to say, reduction in the write threshold current density and improvement of the MR ratio in the spin transfer magnetization switching conflict with each other.

Moreover, a Co—Fe—B thin film having high spin polarization is an in-plane magnetization film whose magnetic anisotropy is in a direction parallel to the film surface. When such an in-plane magnetization film is used as a magnetic layer, it is difficult to sufficiently reduce the write threshold current density in the spin transfer magnetization switching.

An object of the present invention is to provide a technique that can improve write characteristics and read characteristics independently of each other with respect to an MRAM based on the spin transfer magnetization switching method.

In an aspect of the present invention, a magnetoresistance effect element based on the spin transfer magnetization switching method is provided. The magnetoresistance effect element has: a first magnetization fixed layer whose magnetization direction is fixed; a first magnetization free layer whose magnetization direction is variable; a first nonmagnetic layer sandwiched between the first magnetization fixed layer and the first magnetization free layer; a second magnetization fixed layer whose magnetization direction is fixed; a second magnetization free layer whose magnetization direction is variable; and a second nonmagnetic layer sandwiched between the second magnetization fixed layer and the second magnetization free layer. The first magnetization fixed layer and the first magnetization free layer have perpendicular magnetic anisotropy, while the second magnetization fixed layer and the second magnetization free layer have in-plane magnetic anisotropy. The first magnetization free layer and the second magnetization free layer are magnetically coupled to each other. In a plane parallel to each layer, center of the second magnetization free layer is displaced from center of the first magnetization free layer.

According to the present invention, it is possible to improve write characteristics and read characteristics independently of each other with respect to the MRAM based on the spin transfer magnetization switching method.

BRIEF DESCRIPTION OF DRAWINGS

The above and other objects, advantages and features of the present invention will be more apparent from the following description of certain exemplary embodiments taken in conjunction with the accompanying drawings.

FIG. 7C is a x-z side view of the structure shown in FIG. 7A.

FIG. 18C is a x-z side view of the structure shown in FIG. 18A.

BEST MODE FOR CARRYING OUT THE INVENTION

According to an exemplary embodiment of the present invention, a magnetoresistance effect element and an MRAM based on the spin transfer magnetization switching method are provided. The MRAM is provided with a plurality of magnetic memory cells arranged in an array form, and each magnetic memory cell has the magnetoresistance effect element. The magnetoresistance effect element and the MRAM according to the exemplary embodiment will be described with reference to the attached drawings.
(Configuration of Magnetoresistance Effect Element)

Figure 1A:
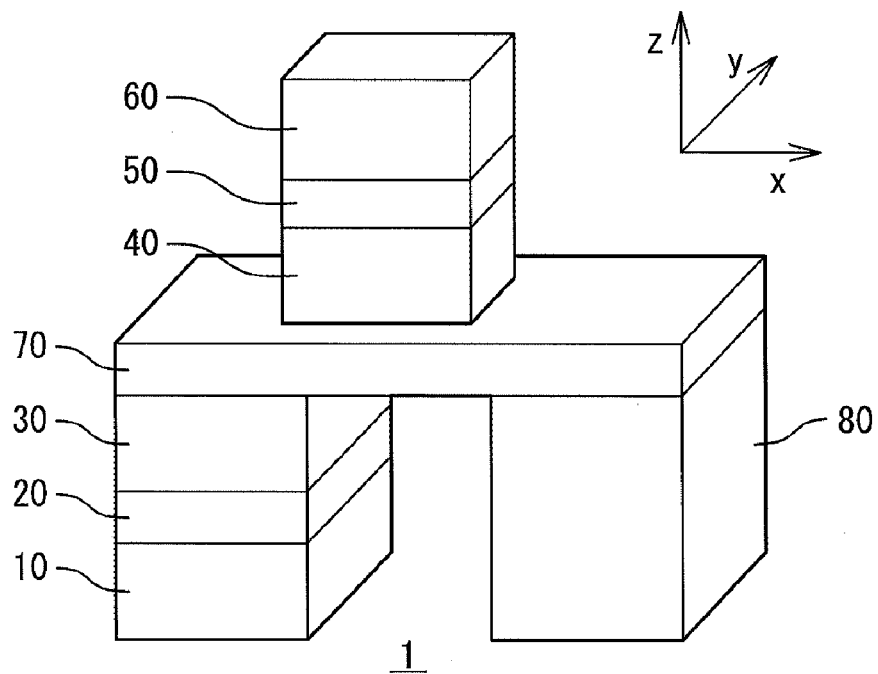
FIG. 1A is a perspective view showing a structure of a magnetoresistance effect element according to an exemplary embodiment of the present invention.
Figure 1B:
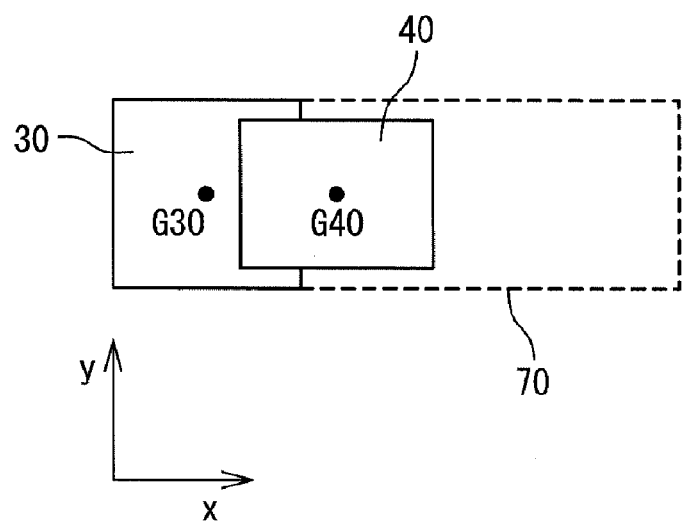
FIG. 1B is a x-y plan view of the structure shown in FIG. 1A.
Figure 1C:
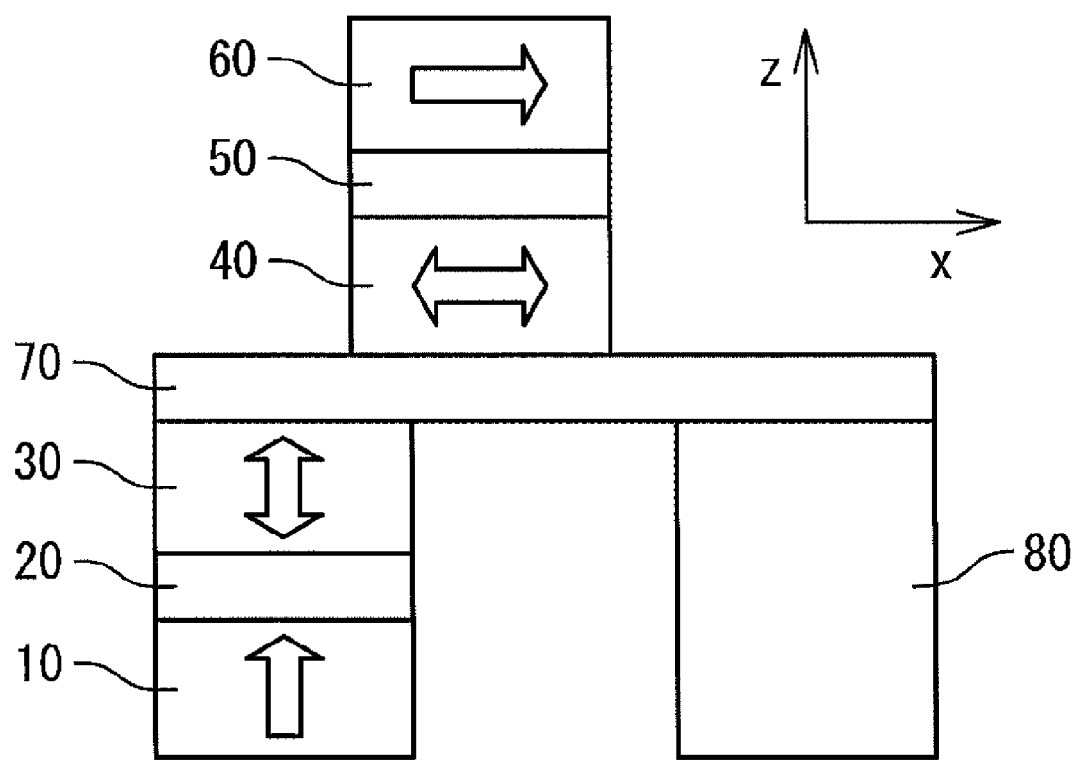
FIG. 1C is a x-z side view of the structure shown in FIG. 1A.

FIG. 1A is a perspective view showing a structure of a magnetoresistance effect element 1 according to an exemplary embodiment of the present invention. FIG. 1B and FIG. 1C respectively are a x-y plan view and a x-z side view of the structure shown in FIG. 1A. The magnetoresistance effect element 1 has a stacked structure including a plurality of layers, and the stack direction is defined as the z-axis direction. A plane parallel to each layer of the stacked structure is the x-y plane.

The magnetoresistance effect element 1 according to the present exemplary embodiment has a first magnetization fixed layer 10, a first spacer layer 20, a first magnetization free layer 30, a second magnetization free layer 40, a second spacer layer 50 and a second magnetization fixed layer 60. The first magnetization fixed layer 10 is provided adjacent to one surface of the first spacer layer 20, and the first magnetization free layer 30 is provided adjacent to the other surface of the first spacer layer 20. That is, the first spacer layer 20 is sandwiched between the first magnetization fixed layer 10 and the first magnetization free layer 30. The second magnetization fixed layer 60 is provided adjacent to one surface of the second spacer layer 50, and the second magnetization free layer 40 is provided adjacent to the other surface of the second spacer layer 50. That is, the second spacer layer 50 is sandwiched between the second magnetization fixed layer 60 and the second magnetization free layer 40.

In the example shown in FIGS. 1A to 1C, the magnetoresistance effect element 1 further has a first conductive layer 70 and a second conductive layer 80. The first conductive layer 70 is so provided as to be electrically connected to the first magnetization free layer 30 and the second magnetization free layer 40. In particular, the first conductive layer 70 is sandwiched between the first magnetization free layer 30 and the second magnetization free layer 40 as shown in FIG. 1A and FIG. 1C. The second conductive layer 80 is so provided as to be electrically connected to the first conductive layer 70. It should be noted that the first conductive layer 70 and the second conductive layer 80 can be omitted, as will be described later.

Moreover, it is desirable that an electrode layer, a diffusion barrier layer, a base layer and the like, which are not shown, are provided as appropriate in addition to the above-mentioned layers.

Each of the first spacer layer 20 and the second spacer layer 50 is a nonmagnetic layer formed of nonmagnetic material. Electrical characteristics of the first spacer layer 20 and the second spacer layer 50 are arbitrary, and material thereof can be any of conductor, insulator and semiconductor. It should be noted that the second spacer layer 50 is preferably formed of insulator.

Each of the first magnetization fixed layer 10, the first magnetization free layer 30, the second magnetization free layer 40 and the second magnetization fixed layer 60 is a ferromagnetic layer formed of ferromagnetic material. The first magnetization fixed layer 10 and the first magnetization free layer 30 among them are perpendicular magnetization films having perpendicular magnetic anisotropy. That is, the first magnetization fixed layer 10 and the first magnetization free layer 30 have magnetic anisotropy in a direction perpendicular to the film surface (in the z-axis direction). On the other hand, the second magnetization free layer 40 and the second magnetization fixed layer 60 are in-plane magnetization films having in-plane magnetic anisotropy. That is, the second magnetization free layer 40 and the second magnetization fixed layer 60 have magnetic anisotropy in a direction parallel to the film surface.

The magnetization direction of each layer is shown in FIG. 1C. The magnetization direction of the first magnetization fixed layer 10 is fixed substantially in one direction. On the other hand, the magnetization direction of the first magnetization free layer 30 is reversible. Since the first magnetization fixed layer 10 and the first magnetization free layer 30 have the perpendicular magnetic anisotropy, the magnetization direction thereof is substantially parallel to the z-axis. In the example shown in FIG. 10, the magnetization of the first magnetization fixed layer 10 is fixed in the +z-direction. On the other hand, the magnetization of the first magnetization free layer 30 is allowed to be directed to the +z-direction or the −z-direction. That is, the magnetization direction of the first magnetization free layer 30 can be parallel to or anti-parallel to the magnetization direction of the first magnetization fixed layer 10.

The magnetization direction of the second magnetization fixed layer 60 is fixed substantially in one direction. On the other hand, the magnetization direction of the second magnetization free layer 40 is reversible. Since the second magnetization fixed layer 60 and the second magnetization free layer 40 have the in-plane magnetic anisotropy, the magnetization direction thereof is substantially parallel to the film surface (x-y plane). In the example shown in FIG. 1C, the magnetization of the second magnetization fixed layer 60 is fixed in the +x-direction. On the other hand, the magnetization of the second magnetization free layer 40 has component in the +x-direction or in the −x-direction. That is, the magnetization direction of the second magnetization free layer 40 has component parallel to or anti-parallel to the magnetization direction of the second magnetization fixed layer 60.

As described above, the magnetoresistance effect element 1 according to the present exemplary embodiment includes a "first magnetoresistance effect element" having the first magnetization fixed layer 10, the first spacer layer 20 and the first magnetization free layer 30 and a "second magnetoresistance effect element" having the second magnetization free layer 40, the second spacer layer 50 and the second magnetization fixed layer 60. Note that the first magnetoresistance effect element includes the perpendicular magnetization film, and the second magnetoresistance effect element includes the in-plane magnetization film. As will be described later, the first magnetoresistance effect element is used in data writing, while the second magnetoresistance effect element is used in data reading.

Moreover, the first magnetization free layer 30 of the first magnetoresistance effect element and the second magnetization free layer 40 of the second magnetoresistance effect element are respectively formed in different layers but are magnetically coupled to each other. In other words, the magnetization state of the first magnetization free layer 30 and the magnetization state of the second magnetization free layer 40 mutually affect each other. It is particularly important that the magnetization state of the first magnetization free layer 30 affects the magnetization state of the second magnetization free layer 40, as will be described later.

Furthermore, FIG. 1B shows locations of center G30 of the first magnetization free layer 30 and center G40 of the second magnetization free layer 40 in the x-y plane. The center here means geometric center in the x-y plane. That is, when a position vector Ri of an arbitrary point i of a geometric configuration is represented by Ri=(Xi, Yi), a position vector Rg=(Xg, Yg) of its center satisfies a relationship: $\sum_i(R_i-R_g)=0$, wherein i means summation with regard to i. For example, in cases of rectangle and parallelogram, the center is an intersection of diagonal lines, and in a case of ellipse, the center is a center of the ellipse.

According to the present exemplary embodiment, the center G30 of the first magnetization free layer 30 and the center G40 of the second magnetization free layer 40 are displaced from each other in the x-y plane. That is, in the x-y plane, the center G40 of the second magnetization free layer 40 is displaced from the center G30 of the first magnetization free layer 30 in a "first direction" parallel to the film surface. In the example shown in FIG. 1B, the first direction (displacement direction) is the +x-direction. The first magnetization free layer 30 and the second magnetization free layer 40 may at least partially overlap with each other or may not overlap with each other.

It should be noted that a shape of each layer in the x-y plane is not limited to rectangle but can be circle, ellipse, diamond, hexagon and the like. Moreover, concavity and convexity may be formed as appropriate on the surface of each layer such that proper characteristics can be obtained. An area of each layer also is arbitrary.

(Principle)

Figure 2A:
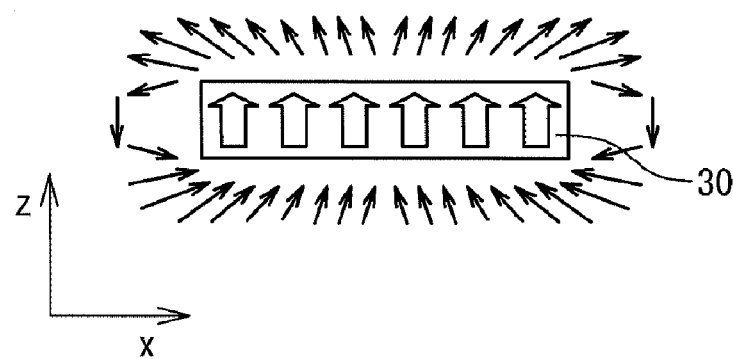
FIG. 2A is a conceptual diagram for explaining principle of the magnetoresistance effect element according to the exemplary embodiment.
Figure 2B:
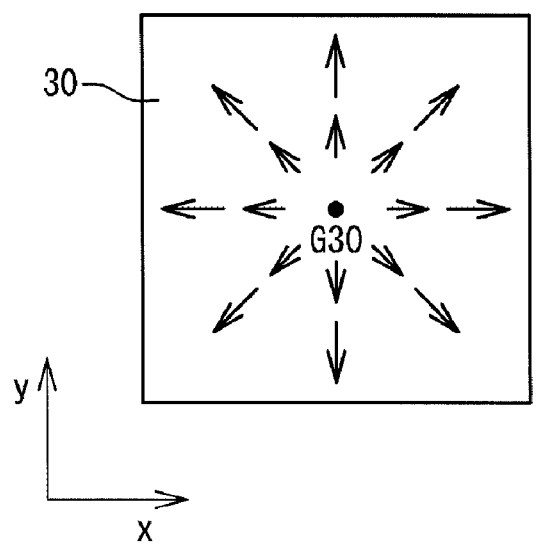
FIG. 2B is a conceptual diagram for explaining principle of the magnetoresistance effect element according to the exemplary embodiment.

Next, principle of the magnetoresistance effect element 1 according to the present exemplary embodiment will be described in detail. FIG. 2A and FIG. 2B schematically illustrate leakage magnetic field (leakage magnetic flux) generated around the first magnetization free layer 30 due to its magnetization. FIG. 2A shows the state in the x-z plane, while FIG. 2B shows the state in the x-y plane.

Let us consider a case where the magnetization direction of the first magnetization free layer 30 is in the +z-axis direction with uniformity. In this case, magnetic field lines of the leakage magnetic field have a roughly dipole configuration as shown in FIG. 2A, namely depart from an upper surface (positive magnetic pole side) of the first magnetization free layer 30 and smoothly connect to a lower surface (negative magnetic pole side) thereof. Moreover, as shown in FIG. 2B, the leakage magnetic field radiates outward from the center G30 of the first magnetization free layer 30. That is, the leakage magnetic field in the vicinity of the center G30 of the first magnetization free layer 30 is nearly in the z-direction, and the leakage magnetic field has a larger xy component (component in the direction parallel to the film surface) as closer to an edge of the first magnetization free layer 30.

As described above, in the x-y plane, the center G40 of the second magnetization free layer 40 is displaced in the "first direction" from the center G30 of the first magnetization free layer 30. Therefore, the leakage magnetic field generated by the magnetization of the first magnetization free layer 30 has the xy component along the "first direction" at the position of the center G40 of the second magnetization free layer 40. That is, the magnetization of the first magnetization free layer 30 exerts magnetic force substantially parallel to or substantially anti-parallel to the "first direction" to the second magnetization free layer 40. As a result, the magnetization of the second magnetization free layer 40 has a component substantially parallel to or substantially anti-parallel to the "first direction".

Figure 2C:
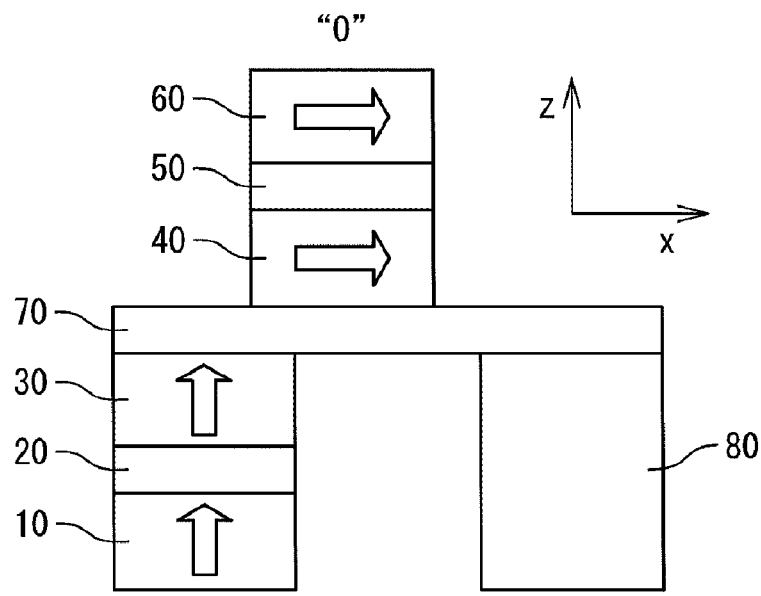
FIG. 2C is a x-z side view for explaining a memory state of the magnetoresistance effect element according to the exemplary embodiment.
Figure 2D:
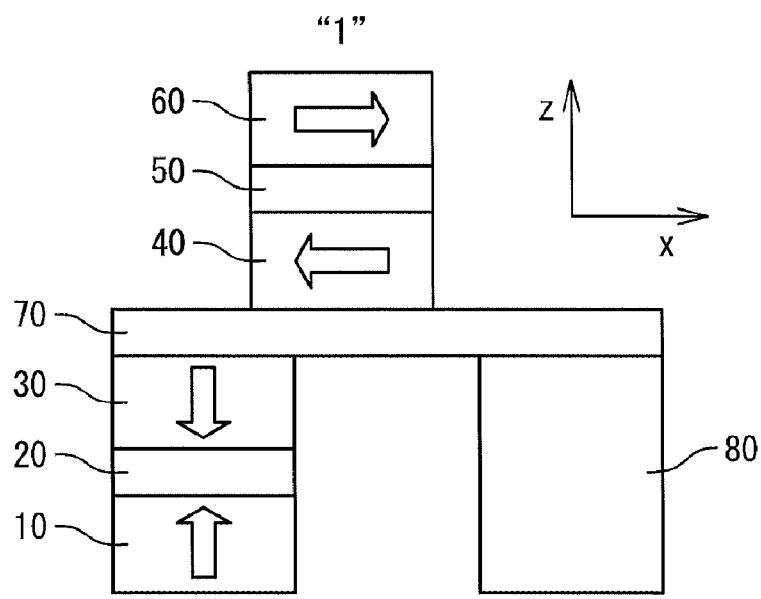
FIG. 2D is a x-z side view for explaining a memory state of the magnetoresistance effect element according to the exemplary embodiment.

FIG. 2C and FIG. 2D respectively exemplify two memory states that the magnetoresistance effect element 1 can be in. In the example shown in FIG. 2C and FIG. 2D, the magnetization direction of the first magnetization fixed layer 10 is fixed in the +z-direction and the magnetization direction of the second magnetization fixed layer 60 is fixed in the +x-direction. One of or both of the magnetization directions may be opposite. Moreover, in the present example, the displacement direction (first direction) of the center G40 of the second magnetization free layer 40 with respect to the center G30 of the first magnetization free layer 30 is the +x-direction. The first direction also is arbitrary. However, it is desirable that the first direction is substantially parallel to or substantially anti-parallel to the magnetization direction of the second magnetization fixed layer 60.

In FIG. 2C, the magnetization of the first magnetization free layer 30 is directed to the +z-direction. In this case, the leakage magnetic field from the first magnetization free layer 30 has the +x component along the first direction at the position of the center G40 of the second magnetization free layer 40. As a result, the magnetization of the second magnetization free layer 40 has a component in the +x-direction due to the magnetic coupling between the first magnetization free layer 30 and the second magnetization free layer 40. In this case, the magnetization direction of the second magnetization free layer 40 has the component that is "parallel" to the magnetization direction of the second magnetization fixed layer 60, and thus a resistance value of the second magnetoresistance effect element having the second magnetization free layer 40, the second spacer layer 50 and the second magnetization fixed layer 60 becomes comparatively low. The memory state shown in FIG. 2C is hereinafter referred to as "0" state.

In FIG. 2D, on the other hand, the magnetization of the first magnetization free layer 30 is directed to the −z-direction. In this case, the leakage magnetic field from the first magnetization free layer 30 has the −x component along the first direction at the position of the center G40 of the second magnetization free layer 40. As a result, the magnetization of the second magnetization free layer 40 has a component in the −x-direction due to the magnetic coupling between the first magnetization free layer 30 and the second magnetization free layer 40. In this case, the magnetization direction of the second magnetization free layer 40 has the component that is "anti-parallel" to the magnetization direction of the second magnetization fixed layer 60, and thus the resistance value of the second magnetoresistance effect element having the second magnetization free layer 40, the second spacer layer 50 and the second magnetization fixed layer 60 becomes comparatively high. The memory state shown in FIG. 2D is hereinafter referred to as "1" state.

As exemplified above, due to the displacement of center and the magnetic coupling between the magnetization free layers 30 and 40, the magnetization direction of the second magnetization free layer 40 is "uniquely" determined depending on the magnetization direction of the first magnetization free layer 30. If the magnetization direction of the first magnetization free layer 30 is reversed, the magnetization direction of the second magnetization free layer 40 also is changed. As a result, difference in a relative angle of the magnetization direction between the second magnetization free layer 40 and the second magnetization fixed layer 60 is caused, which achieves the two memory states: the "0" state and the "1" state. That is, the two memory states are achieved corresponding to the magnetization directions of the first magnetization free layer 30.

It is preferable that the direction of the fixed magnetization of the second magnetization fixed layer 60 is substantially parallel to or substantially anti-parallel to the displacement direction (first direction) of the center between the first magnetization free layer 30 and the second magnetization free layer 40. The reason is that the variable magnetization of the second magnetization free layer 40 has the component substantially parallel to or substantially anti-parallel to the first direction depending on the magnetization direction of the first magnetization free layer 30. In the case where the direction of the fixed magnetization of the second magnetization fixed layer 60 is substantially parallel to or substantially anti-parallel to the first direction, change in the relative angle between the direction of the fixed magnetization and the direction of the variable magnetization of the second magnetization free layer 40 becomes remarkable. As a result, difference between the two memory states becomes conspicuous.

It can be said in the present exemplary embodiment that information stored in the first magnetization free layer 30 in a form of the magnetization component in the perpendicular direction is transmitted through the magnetic coupling to the magnetization component in the in-plane direction of the second magnetization free layer 40. A means for the magnetic coupling is not limited to the above-mentioned one utilizing the leakage magnetic field, as long as such the transmission of information is achieved. The first magnetization free layer 30 and the second magnetization free layer 40 can be magnetically related to each other by any magnetic coupling means such as exchange coupling-based one.

In the above-described example, the magnetization of the second magnetization free layer 40 is completely saturated by the leakage magnetic field from the first magnetization free layer 30. In practice, the magnetization of the second magnetization free layer 40 needs not be saturated. Difference in the magnetization direction of the second magnetization free layer 40 just needs to be caused depending on difference in the magnetization direction of the first magnetization free layer 30.

The magnetization easy axis of the second magnetization free layer 40 can be along any direction, as long as the magnetization direction of the second magnetization free layer 40 can be changed depending on the magnetization direction of the first magnetization free layer 30. In the case of the magnetization easy axis along the x-axis direction as in the above-described example, the magnetization of the second magnetization free layer 40 is switched between directions along the magnetization easy axis. In a case of the magnetization easy axis along the y-axis direction, the magnetization of the second magnetization free layer 40 rotates toward the magnetization hard axis from the magnetization easy axis as a center.

It is not desirable that the magnetic anisotropy of the second magnetization free layer 40 is extremely large. The reason is that the magnetization switching by the leakage magnetic field from the first magnetization free layer 30 becomes difficult if the magnetic anisotropy of the second magnetization free layer 40 is extremely large. The magnetic anisotropy of the second magnetization free layer 40 may be given by magneto-crystalline anisotropy or may be given by shape magnetic anisotropy. The second magnetization free layer 40 may be a stacked film consisting of a plurality of ferromagnetic bodies. A layer formed of nonmagnetic material may be interposed between the ferromagnetic bodies without disturbing the magnetization state.

(Data Writing Method, Data Reading Method)

Next, data writing/reading method with respect to the magnetoresistance effect element 1 according to the present exemplary embodiment will be described.

Figure 3A:
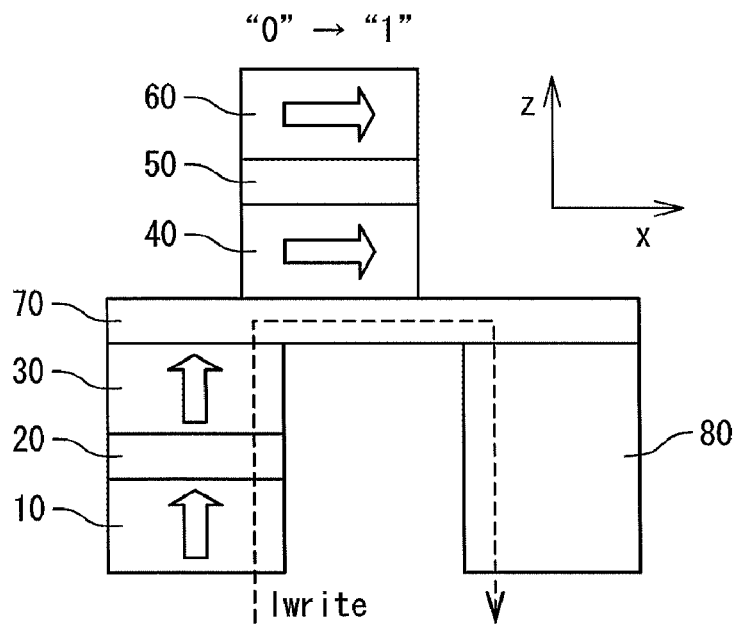
FIG. 3A is a conceptual diagram for explaining a method of writing a data to the magnetoresistance effect element according to the exemplary embodiment.
Figure 3B:
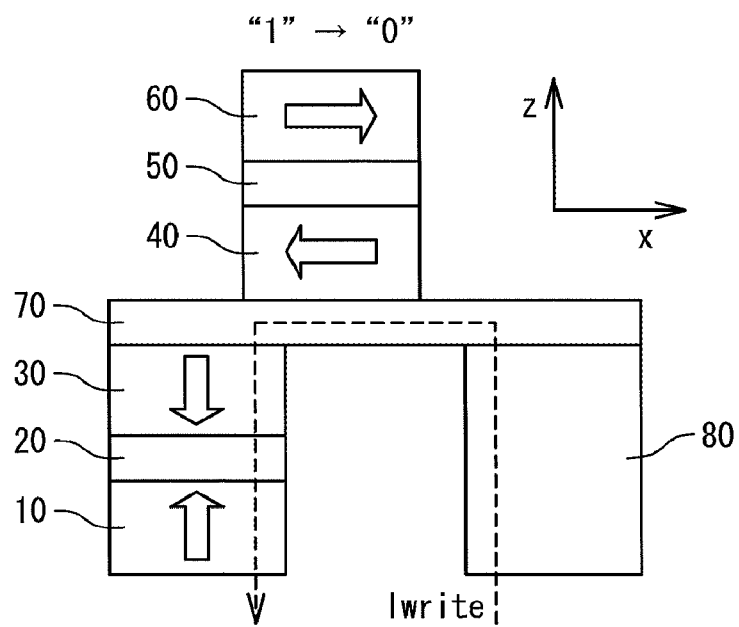
FIG. 3B is a conceptual diagram for explaining a method of writing a data to the magnetoresistance effect element according to the exemplary embodiment.

FIG. 3A and FIG. 3B are conceptual diagrams for explaining a method of writing data to the magnetoresistance effect element 1. The data writing is achieved by the "spin transfer magnetization switching method". More specifically, the "first magnetoresistance effect element" having the first magnetization fixed layer 10, the first spacer layer 20 and the first magnetization free layer 30 is used, and a write current Iwrite is supplied between the first magnetization fixed layer 10 and the first magnetization free layer 30.

FIG. 3A shows a path of the write current Iwrite at a time of transition from the "0" state (refer to FIG. 2C) to the "1" state (refer to FIG. 2D), namely "1" writing. Let us consider a case where the write current Iwrite is introduced in the arrow direction under the "0" state as shown in FIG. 3A. In this case, the write current Iwrite flows from the first magnetization fixed layer 10 through the first spacer layer 20 to the first magnetization free layer 30, and conduction electrons flow from the first magnetization free layer 30 through the first spacer layer 20 to the first magnetization fixed layer 10. In FIG. 3A, the magnetization direction of the first magnetization fixed layer 10 is fixed in the +z-direction, and thus more conduction electrons having the −z-direction spin angular momentum are reflected at the interface of the first magnetization fixed layer 10 as compared with conduction electrons having the +z-direction spin angular momentum. As a result, electrons having the −z-direction spin angular momentum become majority in the first magnetization free layer 30, and hence the magnetization switching to the −z-direction is induced. When the magnetization of the first magnetization free layer 30 is switched to the −z-direction, the magnetization of the second magnetization free layer 40 comes to have the −x-direction component due to the above-described magnetic coupling. That is to say, the "1" state shown in FIG. 2D is obtained.

On the other hand, FIG. 3B shows a path of the write current Iwrite at a time of transition from the "1" state (refer to FIG. 2D) to the "0" state (refer to FIG. 2C), namely "0" writing. Let us consider a case where the write current Iwrite is introduced in the arrow direction under the "1" state as shown in FIG. 3B. In this case, the write current Iwrite flows from the first magnetization free layer 30 through the first spacer layer 20 to the first magnetization fixed layer 10, and conduction electrons flow from the first magnetization fixed layer 10 through the first spacer layer 20 to the first magnetization free layer 30. In FIG. 3B, the magnetization direction of the first magnetization fixed layer 10 is fixed in the +z-direction, and thus lots of conduction electrons having the +z-direction spin angular momentum flow into the first magnetization free layer 30. As a result, electrons having the +z-direction spin angular momentum become majority in the first magnetization free layer 30, and hence the magnetization switching to the +z-direction is induced. When the magnetization of the first magnetization free layer 30 is switched to the +z-direction, the magnetization of the second magnetization free layer 40 comes to have the +x-direction component due to the above-described magnetic coupling. That is to say, the "0" state shown in FIG. 2C is obtained.

In this manner, the "1" writing from the "0" state and the "0" writing from the "1" state are achieved. Although not shown, "0" writing from the "0" state and "1" writing from the "1" state, namely overwriting is also possible.

In the example shown in FIG. 3A, the write current Iwrite flows from the first magnetoresistance effect element to the second conductive layer 80 through the first conductive layer 70. In the example shown in FIG. 3B, the write current Iwrite flows from the second conductive layer 80 into the first magnetoresistance effect element through the first conductive layer 70. However, a method of supplying the write current Iwrite to the first magnetoresistance effect element is not limited to the examples shown in FIG. 3A and FIG. 3B. The write current Iwrite just needs to flow bi-directionally between the first magnetization fixed layer 10 and the first magnetization free layer 30, and the current path of the other portion can be designed arbitrarily.

Regarding the junction of the first magnetization fixed layer 10 and the first magnetization free layer 30, it is desirable that the area is moderately small. The reason is that the current density is increased and hence a current value required for the writing can be reduced as the area becomes smaller. Preferably, a characteristic length is not more than 100 nm.

Figure 4A:
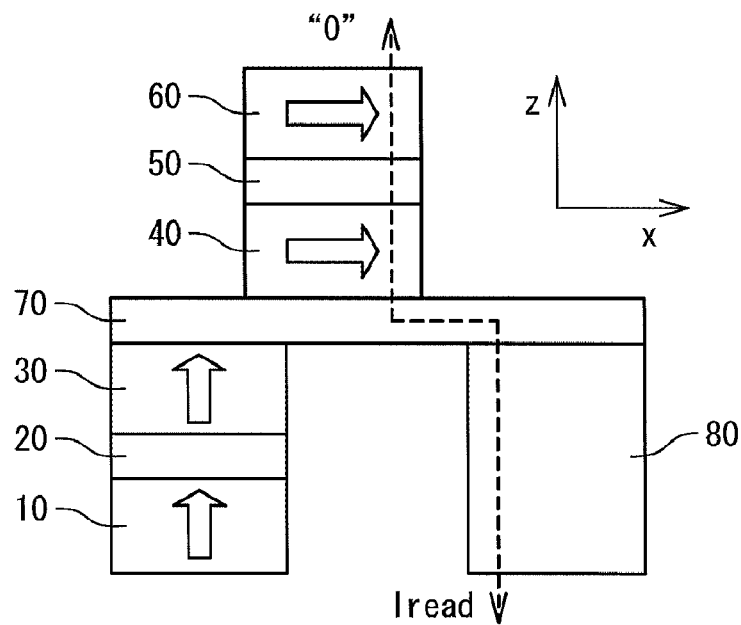
FIG. 4A is a conceptual diagram for explaining a method of reading a data from the magnetoresistance effect element according to the exemplary embodiment.
Figure 4B:
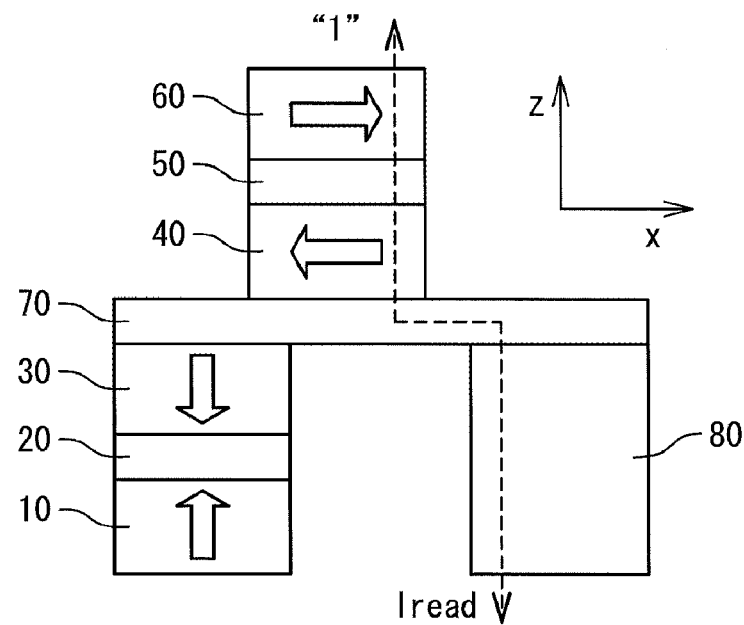
FIG. 4B is a conceptual diagram for explaining a method of reading a data from the magnetoresistance effect element according to the exemplary embodiment.

FIG. 4A and FIG. 4B are conceptual diagrams for explaining a method of reading data from the magnetoresistance effect element 1. In the data reading, high and low of the resistance value due to the magnetoresistance effect is detected. To that end, the "second magnetoresistance effect element" having the second magnetization free layer 40, the second spacer layer 50 and the second magnetization fixed layer 60 is used, and a read current Iread is supplied between the second magnetization free layer 40 and the second magnetization fixed layer 60.

FIG. 4A shows a case of the "0" state (refer to FIG. 2C). In this case, the magnetization direction of the second magnetization free layer 40 is substantially parallel to the magnetization direction of the second magnetization fixed layer 60, and the resistance value of the second magnetoresistance effect element is comparatively low. On the other hand, FIG. 4B shows a case of the "1" state (refer to FIG. 2D). In this case, the magnetization direction of the second magnetization free layer 40 is substantially anti-parallel to the magnetization direction of the second magnetization fixed layer 60, and the resistance value of the second magnetoresistance effect element is comparatively high. Magnitude of the read current Iread or a read voltage corresponding to the read current Iread varies depending on whether the state is the "0" state or the "1" state. Therefore, whether it is the "0" state or the "1" state can be determined by comparing the read current tread or the read voltage with a predetermined reference level. That is, it is possible to read out the information stored in the magnetoresistance effect element 1.

In the example shown in FIG. 4A and FIG. 4B, the read current tread flows through the first conductive layer 70 and the second conductive layer 80. However, a method of supplying the read current tread to the second magnetoresistance effect element is not limited to the example shown in FIG. 4A and FIG. 4B. The read current tread just needs to flow bi-directionally between the second magnetization free layer 40 and the second magnetization fixed layer 60, and the current path of the other portion can be designed arbitrarily.

In the magnetoresistance effect element 1 according to the present exemplary embodiment, as described above, the first magnetization fixed layer 10, the first spacer layer 20 and the first magnetization free layer 30 are used at the time of the data writing. In this sense, the first magnetization fixed layer 10, the first spacer layer 20 and the first magnetization free layer 30 are referred to as a "write layer group". On the other hand, the second magnetization free layer 40, the second spacer layer 50 and the second magnetization fixed layer 60 are used at the time of the data reading. In this sense, the second magnetization free layer 40, the second spacer layer 50 and the second magnetization fixed layer 60 are referred to as a "read layer group".

According to the present exemplary embodiment, the write layer group and the read layer group are separately provided but are mutually related through the magnetic coupling. The information stored in the first magnetization free layer 30 of the write layer group is transmitted through the magnetic coupling to the second magnetization free layer 40 of the read layer group. To put it the other way around, the information transmission through the magnetic coupling makes it possible to provide the write layer group for use in the writing and the read layer group for use in the reading separately from each other. It is therefore possible to optimize the write layer group and the read layer group independently of each other such that desired characteristics are obtained respectively, which enables both improvement in the write characteristics and improvement in the read characteristics simultaneously. For example, a perpendicular magnetization film having appropriate material characteristics can be applied to the write layer group in order to reduce the write threshold current density, while an MTJ exhibiting a high MR ratio can be applied to the read layer group.

(Material)

Next, examples of material of each layer of the magnetoresistance effect element 1 will be described. Materials described below are just examples, and any material can be used in practice as long as the above-described magnetization state can be realized.

The first magnetization fixed layer 10 and the first magnetization free layer 30 that are perpendicular magnetization films are formed of ferromagnetic material including at least one material selected from Fe, Co and Ni. Moreover, the perpendicular magnetic anisotropy can be stabilized by adding Pt, Pd and the like. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Concrete examples of the material include Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co and Gd—Tb—Fe—Co. Besides, the perpendicular magnetic anisotropy can be achieved also by stacking a layer including at least one material selected from Fe, Co and Ni and another layer. Concrete examples of the stacked film include Co/Pd, Co/Pt, Co/Ni and Fe/Au.

The second magnetization free layer 40 and the second magnetization fixed layer 60 that are in-plane magnetization films are formed of ferromagnetic material including at least one material selected from Fe, Co and Ni. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au and the like. Concrete examples of the material include Ni—Fe, Co—Fe, Fe—Co—Ni, Ni—Fe—Zr, Co—Fe—B and Co—Fe—Zr—B.

As to the first spacer layer 20, various materials can be used. For example, conductor such as Al, Cr and Cu can be used. Alternatively, insulator such as Mg—O may be used. As shown in FIG. 3A and FIG. 3B, the first spacer layer 20 exists on the write current path. It is generally desirable that resistance of the write current path is low. From this point of view, low resistance material is preferable. Whereas, if the first spacer layer 20 has a filtering effect that preferentially allows passage of spin polarized electrons of one-polarity, the current density required for the writing can be reduced. From this point of view, Mg—O is preferable. The material of the first spacer layer 20 can be selected appropriately depending on application of the magnetoresistance effect element 1.

It is preferable that the second spacer layer 50 is formed of insulating material. Concrete examples of the material include Mg—O, Al—O, Al—N, Ni—O and Hf—O. It should be noted that semiconductor or metal can also be used as the material.

Since the second magnetization free layer 40, the second spacer layer 50 and the second magnetization fixed layer 60 exist on the read current path as shown in FIG. 4A and FIG. 4B, it is preferable that they are formed of material that can achieve a high MR ratio. For example, it has been recently reported that a giant MR ratio as large as 500% can be obtained in a Co—Fe—B/Mg—O/Co—Fe—B magnetic tunnel junction (MTJ) (refer to the Non-patent Document No. 1). From this point of view, it is preferable that the second spacer layer 50 includes Mg—O. Moreover, it is preferable that at least one of the second magnetization free layer 40 and the second magnetization fixed layer 60 includes Co—Fe—B.

Moreover, a stacked film (synthetic ferrimagnetic coupled layer) in which magnetizations are anti-parallel coupled can be applied to the magnetization fixed layer such as the first magnetization fixed layer 10 and the second magnetization fixed layer 60. In this case, the magnetization of the magnetization fixed layer can be fixed more strongly and influence of the leakage magnetic field on the outside can be reduced. Magnetostatic coupling and exchange coupling based on RKKY interaction can be considered as a type of the anti-parallel coupling. For example, the second magnetization fixed layer 60 can be formed of a stacked film Co—Fe—B/Ru/Co—Fe—B. In this case, the upper and lower Co—Fe—B films are anti-parallel coupled due to the RKKY interaction of the Ru film. As a result, the fixed magnetization can be fixed more strongly and influence of the leakage magnetic field on the outside can be reduced.

Furthermore, the magnetization can be fixed more strongly by providing an anti-ferromagnetic layer adjacent to the magnetization fixed layer such as the first magnetization fixed layer 10 and the second magnetization fixed layer 60. Examples of material of the anti-ferromagnetic layer include Pt—Mn, Ir—Mn and Fe—Mn. For example, an anti-ferromagnetic layer formed of Pt—Mn can be provided adjacent to the second magnetization fixed layer 60 formed of Co—Fe—B/Ru/Co—Fe—B.

It is preferable that the first conductive layer 70 and the second conductive layer 80 are formed of low electric resistance material. Moreover, by appropriately select material of the first conductive layer 70, the first magnetization free layer 30 immediately under it can be protected from fabrication process. From this point of view, high chemical stability material is preferable. Moreover, it is possible to control growth of the second magnetization free layer 40 by appropriately select material of the first conductive layer 70 that is a base layer of the second magnetization free layer 40.

The first conductive layer 70 sandwiched between the first magnetization free layer 30 and the second magnetization free layer 40 may be formed of magnetic material such as Fe, Co and Ni. In this case, the leakage magnetic flux from the first magnetization free layer 30 can be efficiently transmitted to the second magnetization free layer 40, which is preferable from a viewpoint of the above-mentioned magnetic coupling. From this point of view, it is preferable that the first conductive layer 70 is formed of high magnetic permeability material.

(Circuit Configuration)

Next, a circuit configuration for introducing the write current and the read current to the magnetic memory cell having the magnetoresistance effect element 1 according to the present exemplary embodiment.

Figure 5:
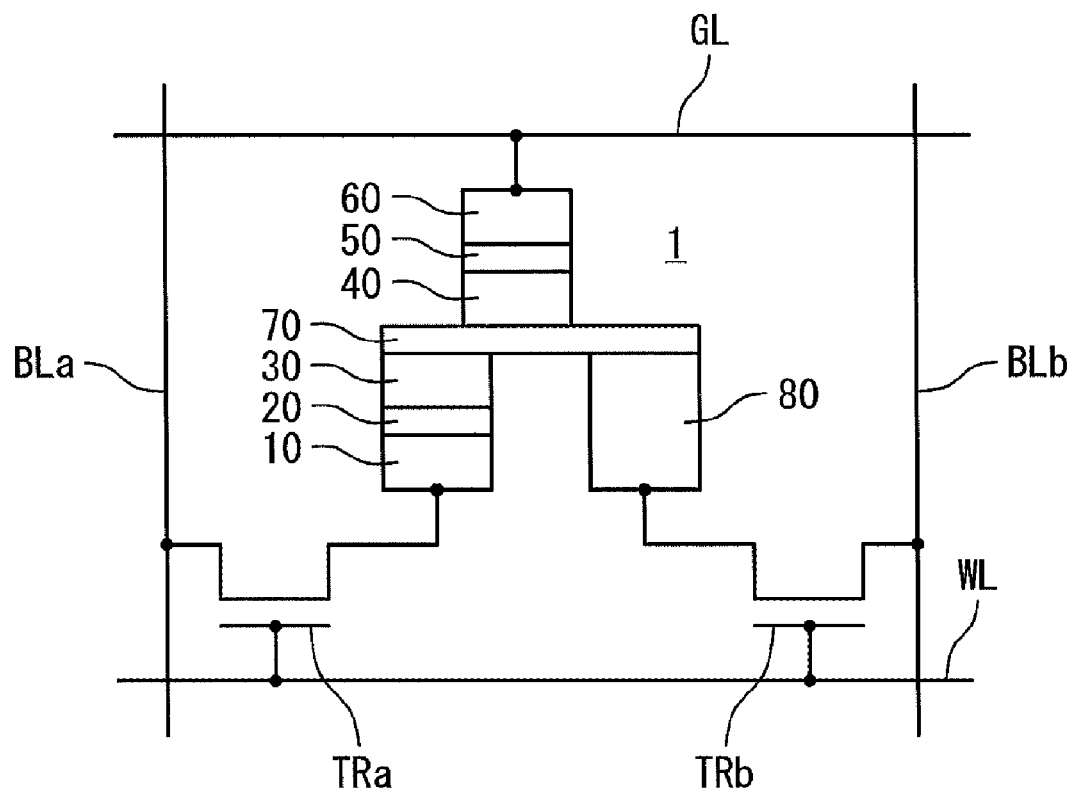
FIG. 5 is a circuit diagram showing one example of a circuit configuration of one bit magnetic memory cell.

FIG. 5 shows an example of a circuit configuration of one bit magnetic memory cell. In the example shown in FIG. 5, the magnetoresistance effect element 1 is a three-terminal element and is connected to a word line WL, a ground line GL and a bit line pair BLa, BLb. For example, a terminal connecting to the second magnetization fixed layer 60 is connected to the ground line GL for use in the reading. A terminal connecting to the first magnetization fixed layer 10 is connected one of source/drain of a transistor TRa, and the other of the source/drain is connected to the bit line BLa. A terminal connecting to the second conductive layer 80 is connected to one of source/drain of a transistor TRb, and the other of the source/drain is connected to the bit line BLb. Gates of the transistors TRa and TRb are connected to a common word line WL.

At the time of data writing, the word line WL is set to High level, and hence the transistors TRa and TRb are turned ON. Also, one of the bit line pair BLa, BLb is set to High level and the other is set to Low level (ground level). As a result, the write current flows between the bit line BLa and the bit line BLb through the transistors TRa and TRb and the write layer group of the magnetoresistance effect element 1. Which of the bit line pair BLa, BLb is to be set to the High level makes it possible to control the direction of the write current, i.e., to write data "0" and "1" distinctly.

At the time of data reading, the word line WL is set to High level, and hence the transistors TRa and TRb are turned ON. Also, the bit line BLa is set to Open state, and the bit line BLb is set to High level. As a result, the read current flows from the bit line BLb to the ground line GL through the transistor TRb and the read layer group of the magnetoresistance effect element 1. A high-speed read operation utilizing the magnetoresistance effect is possible.

(Effects)

According to the present exemplary embodiment, it is possible to improve write characteristics, data retention characteristics and read characteristics independently of each other with respect to the MRAM based on the spin transfer magnetization switching method. This results from a fact that a portion contributing to the writing and memory data retention and a portion contributing to the reading are different from each other in the magnetoresistance effect element 1 according to the present exemplary embodiment. As described in the Patent Document No. 1, it is possible to perform the spin transfer magnetization switching with the write threshold current density not more than 5 MA/cm$^2$ by using a perpendicular magnetization film whose parameters are appropriately set. On the other hand, as described in the Non-patent Document No. 1, it is possible to obtain a MR ratio as high as 500% by using an MTJ having a certain stacked structure.

According to the present exemplary embodiment, it is possible to reduce the write threshold current density by forming the first magnetization fixed layer 10 and the first magnetization free layer 30 responsible for the data writing/retention by using the perpendicular magnetization film. At the same time, it is possible to enhance the MR ratio and thus to increase the read-out signal by forming the second magnetization free layer 40 and the second magnetization fixed layer 60 responsible for the data reading by using the in-plane magnetization film.

Here, let us consider one MTJ that uses a perpendicular magnetization film in order to reduce the write threshold current density. To concurrently improve read characteristics of the same MTJ is considered to be difficult due to the following reason. As mentioned in the Patent Document No. 1, it is desirable for achieving reduction in the write threshold current density that the saturation magnetization of a recording layer (corresponding to the first magnetization free layer 30 in the present case) is moderately small. However, as the saturation magnetization becomes smaller, the spin polarization of the magnetic layer is generally lowered. When the spin polarization is lowered, the MR ratio contributing to the magnitude of the read-out signal becomes smaller. That is to say, the perpendicular magnetization film preferable for the reduction in the write threshold current density hardly achieves improvement in the read characteristics.

Whereas, let us consider one MTJ using an in-plane magnetization film (e.g. Co—Fe—B) that can achieve a high MR ratio. To sufficiently reduce the write threshold current density in the same MTJ is difficult. Moreover, when the element size is reduced, it becomes difficult to ensure thermal disturbance tolerance of retention data. According to the present exemplary embodiment, the data is retained by the first magnetization free layer 30 formed of the perpendicular magnetization film, which can ensure sufficient thermal disturbance tolerance. The reason is that the perpendicular magnetization film generally has sufficiently high magnetic anisotropy energy density (Ku).

First Modification Example

A first modification example relates to a positional relationship of the first magnetization free layer 30 and the second magnetization free layer 40 in the x-y plane. The positional relationship of the first magnetization free layer 30 and the second magnetization free layer 40 is not limited to the foregoing example. In the x-y plane, the center G40 of the second magnetization free layer 40 just needs to be located in the "first direction" from the center G30 of the first magnetization free layer 30.

Figure 6A:
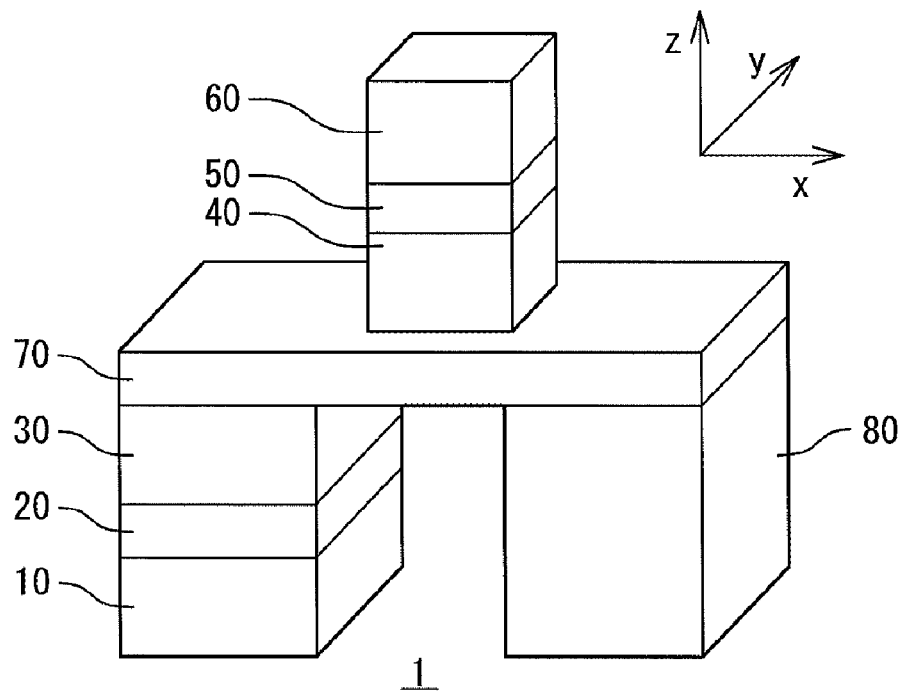
FIG. 6A is a perspective view showing an example of the structure of the magnetoresistance effect element in a first modification example.
Figure 6B:
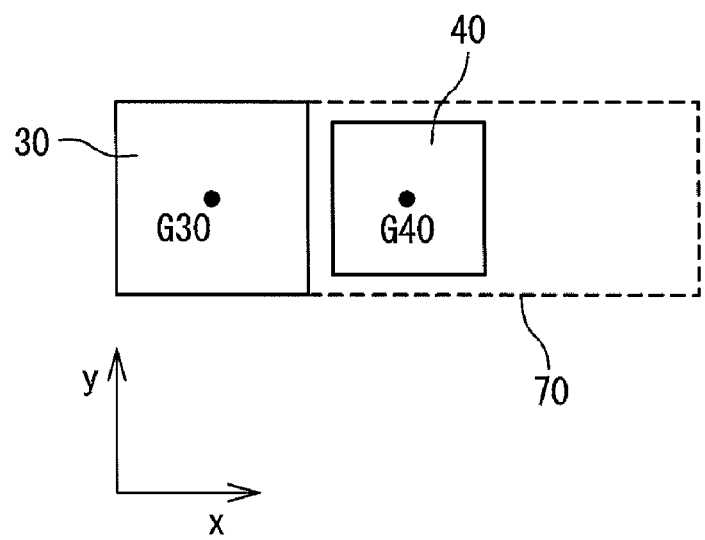
FIG. 6B is a x-y plan view of the structure shown in FIG. 6A.
Figure 6C:
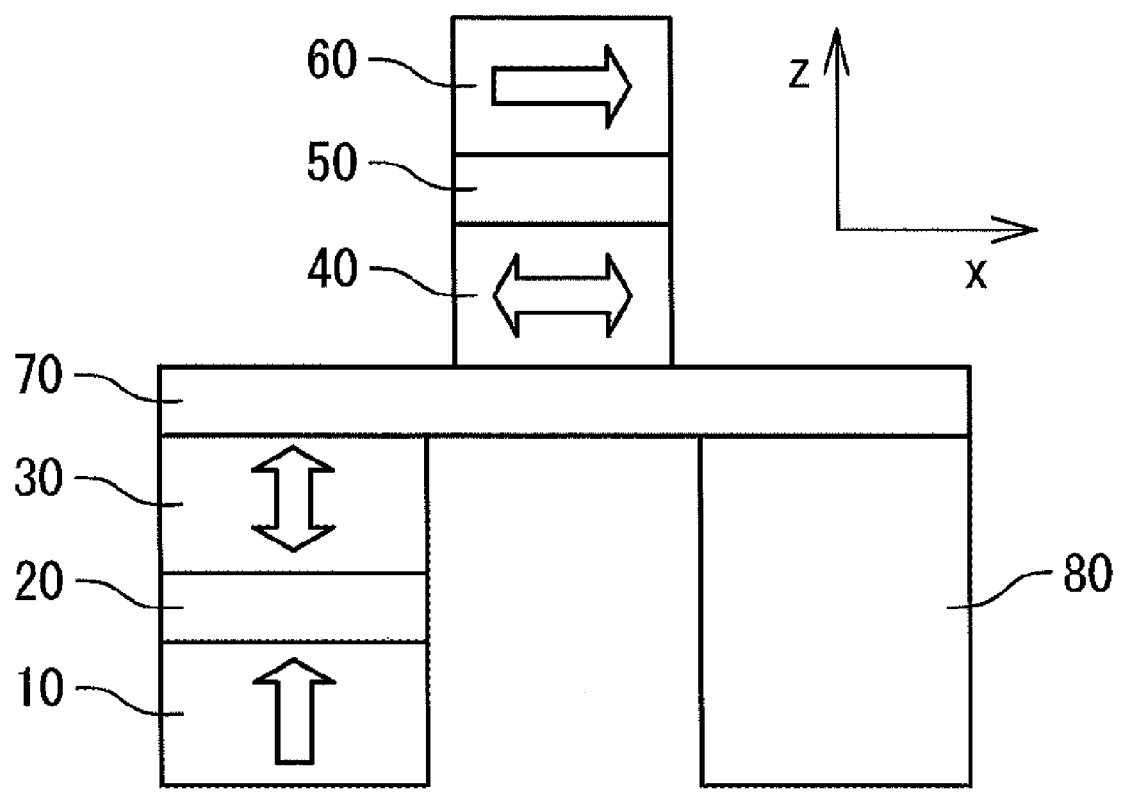
FIG. 6C is a x-z side view of the structure shown in FIG. 6A.

FIG. 6A is a perspective view showing an example of the structure of the magnetoresistance effect element 1. FIG. 6B and FIG. 6C respectively are a x-y plan view and a x-z side view of the structure shown in FIG. 6A. FIGS. 6A to 6C shows an example where the first magnetization free layer 30 and the second magnetization free layer 40 do not overlap with each other. In this case also, the center G40 of the second magnetization free layer 40 is displaced from the center G30 of the first magnetization free layer 30 in the x-y plane. Therefore, the magnetization direction of the second magnetization free layer 40 is uniquely determined by the leakage magnetic field radiating outward from the first magnetization free layer 30.

Figure 7A:
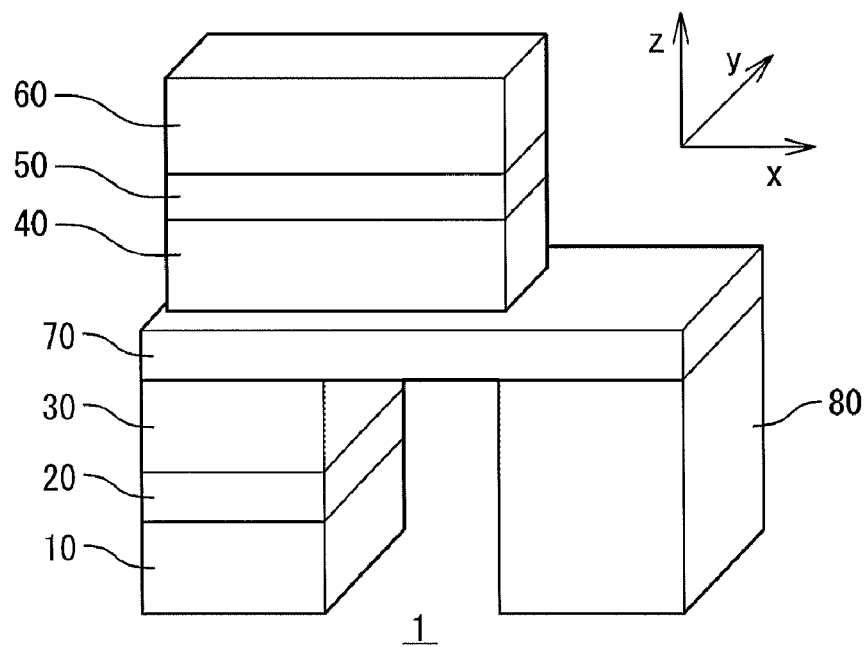
FIG. 7A is a perspective view showing another example of the structure of the magnetoresistance effect element in the first modification example.
Figure 7B:
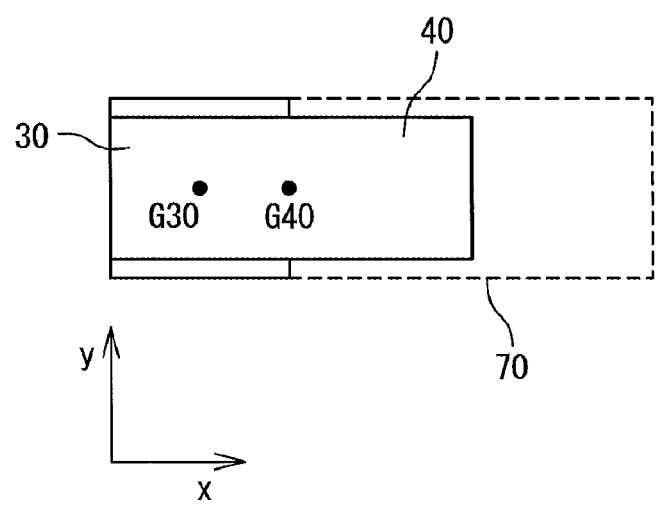
FIG. 7B is a x-y plan view of the structure shown in FIG. 7A.

FIG. 7A is a perspective view showing another example of the structure of the magnetoresistance effect element 1. FIG. 7B and FIG. 7C respectively are a x-y plan view and a x-z side view of the structure shown in FIG. 7A. In the example shown in FIGS. 7A to 7C, the second magnetization free layer 40 is so provided as to cross the first magnetization free layer 30 in the x-y plane. In this case also, the center G40 of the second magnetization free layer 40 is displaced from the center G30 of the first magnetization free layer 30 in the x-y plane. Therefore, the magnetization direction of the second magnetization free layer 40 is uniquely determined by the leakage magnetic field radiating outward from the first magnetization free layer 30.

Figure 8A:
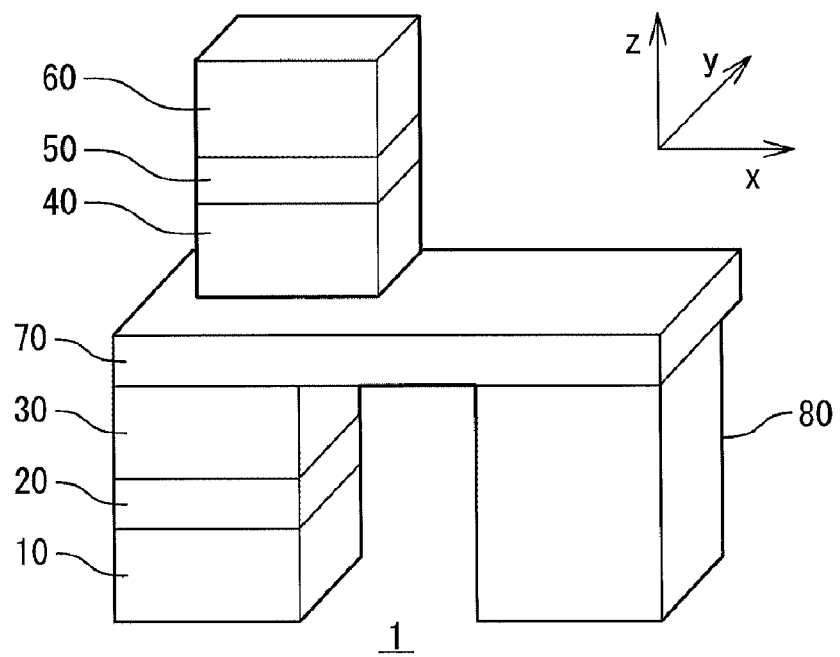
FIG. 8A is a perspective view showing still another example of the structure of the magnetoresistance effect element in the first modification example.
Figure 8B:
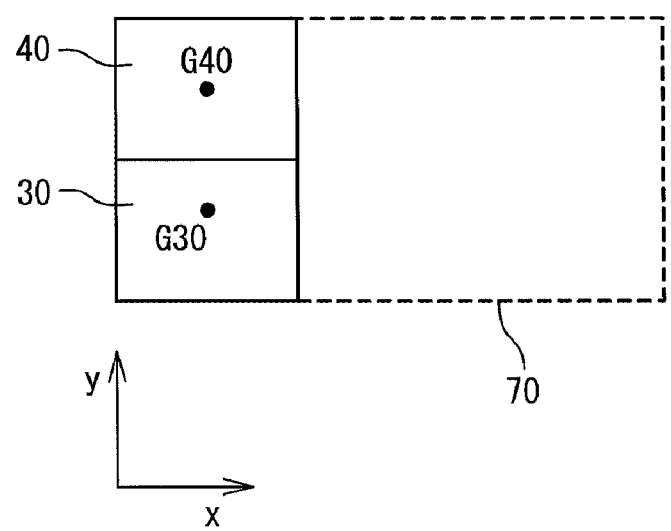
FIG. 8B is a x-y plan view of the structure shown in FIG. 8A.
Figure 8C:
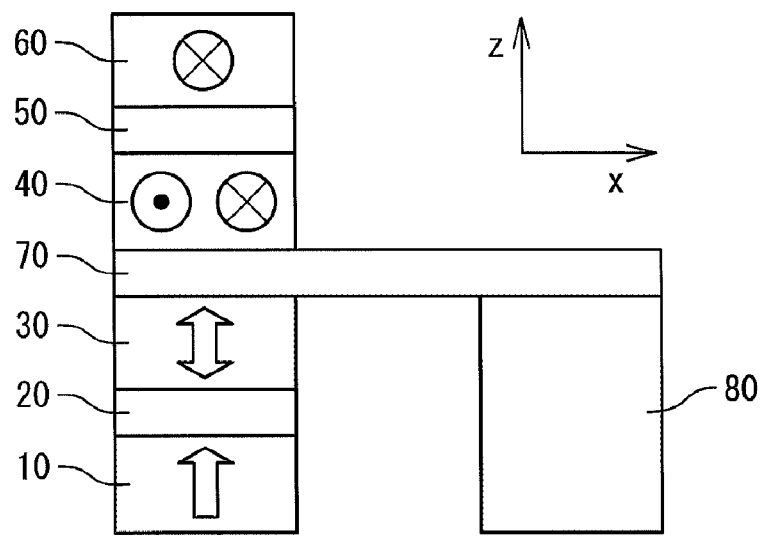
FIG. 8C is a x-z side view of the structure shown in FIG. 8A.
Figure 8D:
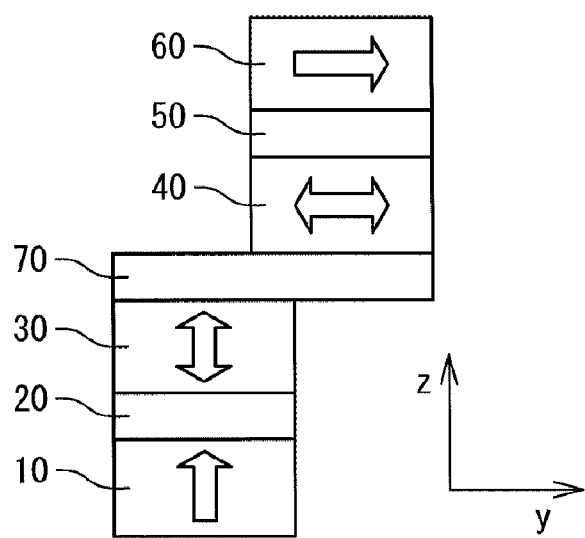
FIG. 8D is a y-z side view of the structure shown in FIG. 8A.

FIG. 8A is a perspective view showing still another example of the structure of the magnetoresistance effect element 1. FIGS. 8B, 8C and 8D respectively are a x-y plan view, a x-z side view and a y-z side view of the structure shown in FIG. 8A. In the example shown in FIGS. 8A to 8D, the displacement direction (first direction) in the x-y plane between the first magnetization free layer 30 and the second magnetization free layer 40 is different from a longitudinal direction of the first conductive layer 70. More specifically, the longitudinal direction of the first conductive layer 70 is the x-axis direction, and the first direction is the y-axis direction different from the x-axis direction. That is, in the x-y plane, the center G40 of the second magnetization free layer 40 is displaced in the y-axis direction from the center G30 of the first magnetization free layer 30. Therefore, the magnetization direction of the second magnetization free layer 40 is uniquely determined by the leakage magnetic field radiating outward from the first magnetization free layer 30. In this case, the magnetization direction of the second magnetization free layer 40 comes to have a component in the +y-direction or in the −y-direction depending on the magnetization direction of the first magnetization free layer 30. It is desirable that the magnetization direction of the second magnetization fixed layer 60 is fixed in any one of the +y-direction and the −y-direction.

Second Modification Example

A second modification example relates to a positional relationship of respective layers of the magnetoresistance effect element 1 in the z-axis direction (stack direction). As described above, the first magnetization fixed layer 10, the first spacer layer 20 and the first magnetization free layer 30 form the "write layer group", and the second magnetization free layer 40, the second spacer layer 50 and the second magnetization fixed layer 60 form the "read layer group". Also, the first conductive layer 70 and the second conductive layer 80 form the "plug group" for introducing current to the write layer group and the read layer group. The positional relationship of the write layer group, the read layer group and the plug group is not limited to the foregoing example. The first magnetization free layer 30 of the write layer group and the second magnetization free layer 40 of the read layer group just need to be respectively formed in different layers and be magnetically coupled to each other.

Figure 9A:
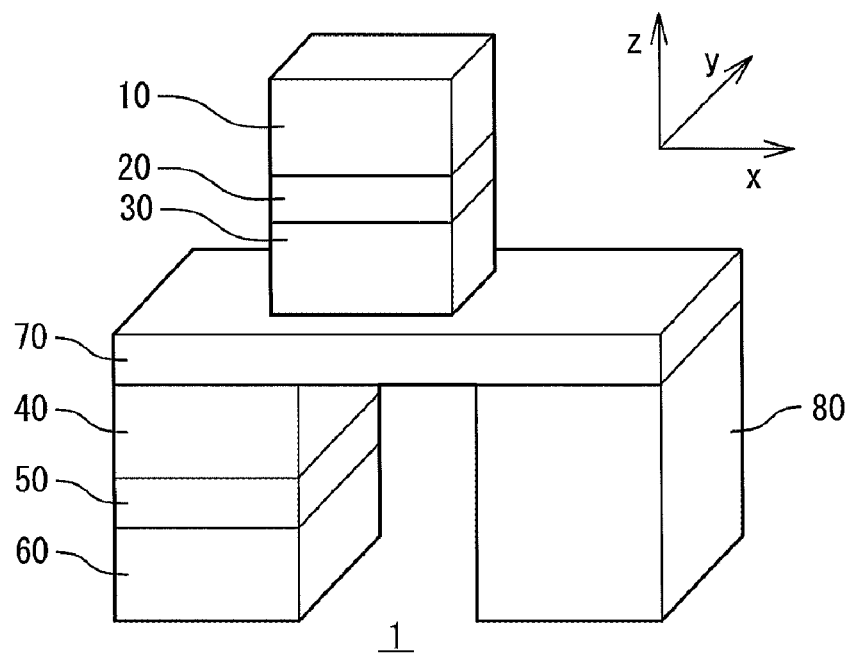
FIG. 9A is a perspective view showing an example of the structure of the magnetoresistance effect element in a second modification example.
Figure 9B:
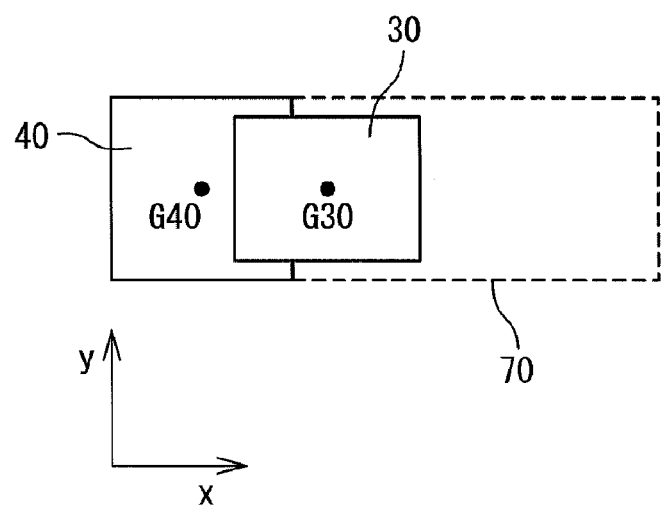
FIG. 9B is a x-y plan view of the structure shown in FIG. 9A.
Figure 9C:
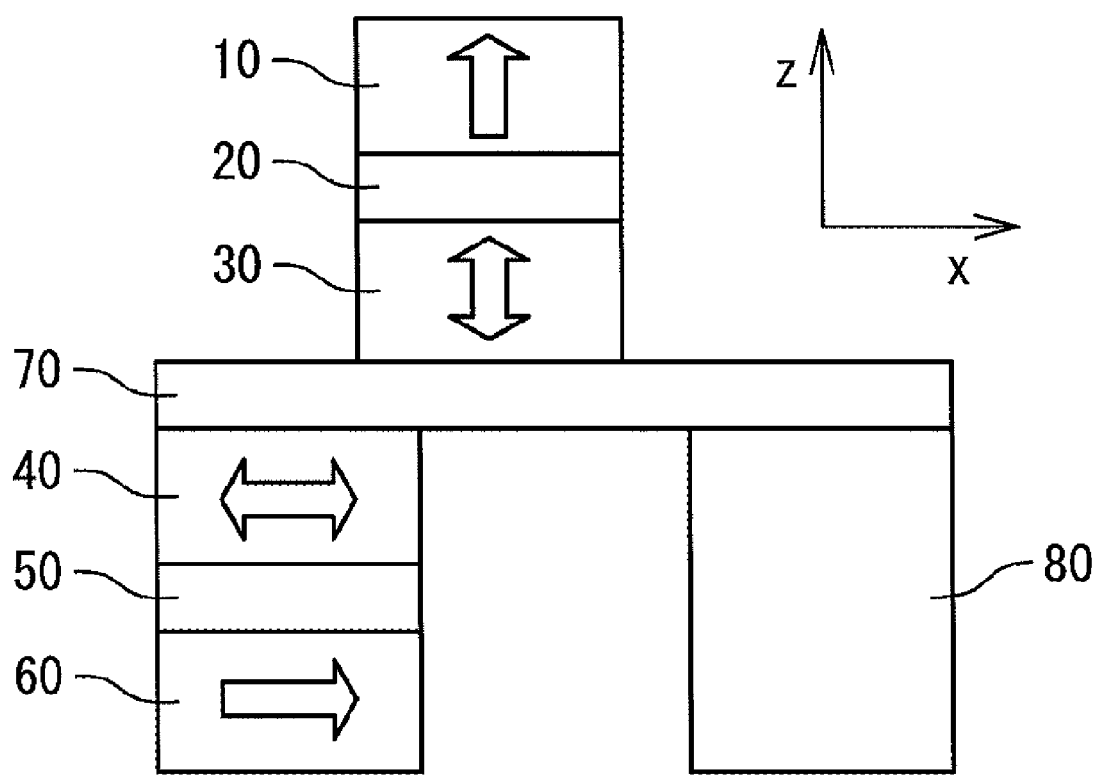
FIG. 9C is a x-z side view of the structure shown in FIG. 9A.

FIG. 9A is a perspective view showing an example of the structure of the magnetoresistance effect element 1. FIG. 9B and FIG. 9C respectively are a x-y plan view and a x-z side view of the structure shown in FIG. 9A. In the example shown in FIGS. 9A to 9C, the write layer group is provided above the read layer group. The second conductive layer 80 is provided on the read layer group side (lower side) of the first conductive layer 70. In this case also, the first magnetization free layer 30 of the write layer group and the second magnetization free layer 40 of the read layer group are magnetically coupled to each other. Furthermore, the center G40 of the second magnetization free layer 40 is displaced from the center G30 of the first magnetization free layer 30 in the x-y plane. Therefore, the magnetization direction of the second magnetization free layer 40 is uniquely determined by the leakage magnetic field radiating outward from the first magnetization free layer 30.

Figure 10A:
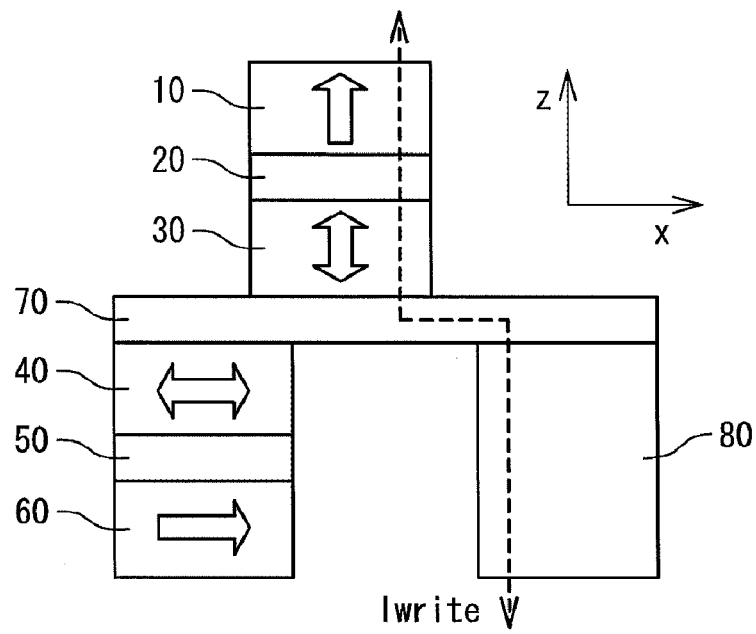
FIG. 10A is a conceptual diagram for explaining a method of writing a data to the magnetoresistance effect element according to the second modification example.
Figure 10B:
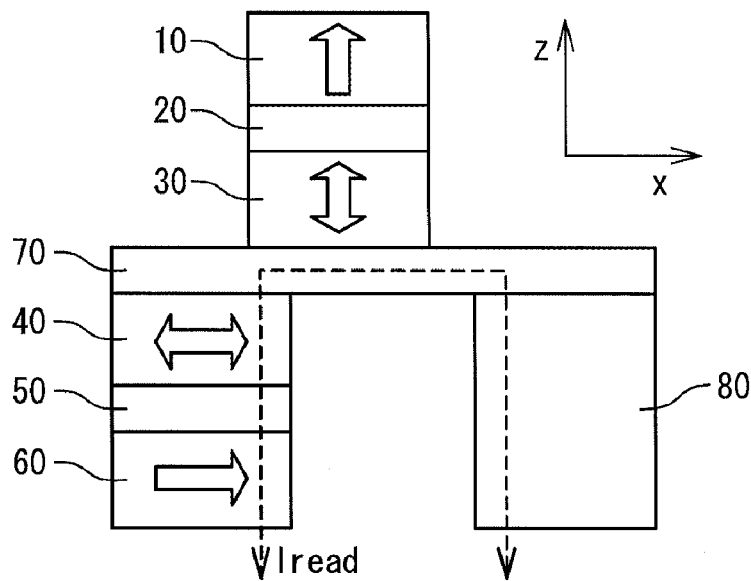
FIG. 10B is a conceptual diagram for explaining a method of reading a data from the magnetoresistance effect element according to the second modification example.

FIG. 10A conceptually shows the write current Iwrite in the case of the example shown in FIGS. 9A to 9C. As in the case of the foregoing examples, the write current Iwrite flows from the plug group to the write layer group or from the write layer group to the plug group. Both of the "0" writing and the "1" writing can be achieved by changing the direction of the write current Iwrite. FIG. 10B conceptually shows the read current Iread in the case of the example shown in FIGS. 9A to 9C. As in the case of the foregoing examples, the read current Iread is introduced to the read layer group by using the plug group.

Figure 11A:
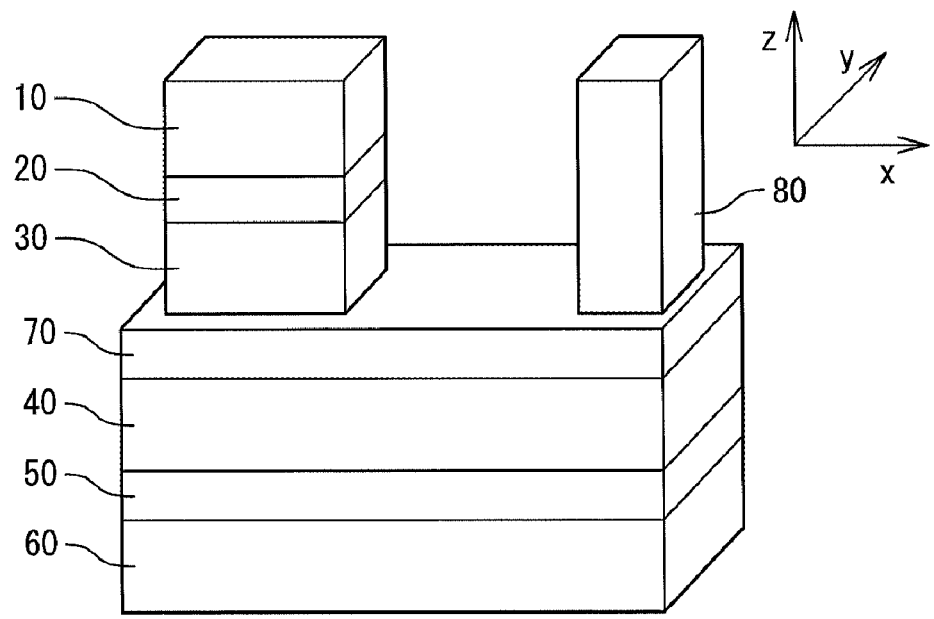
FIG. 11A is a perspective view showing another example of the structure of the magnetoresistance effect element in the second modification example.
Figure 11B:
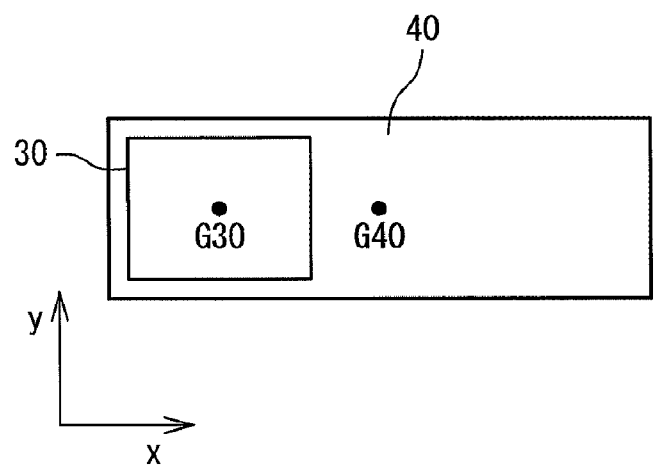
FIG. 11B is a x-y plan view of the structure shown in FIG. 11A.
Figure 11C:
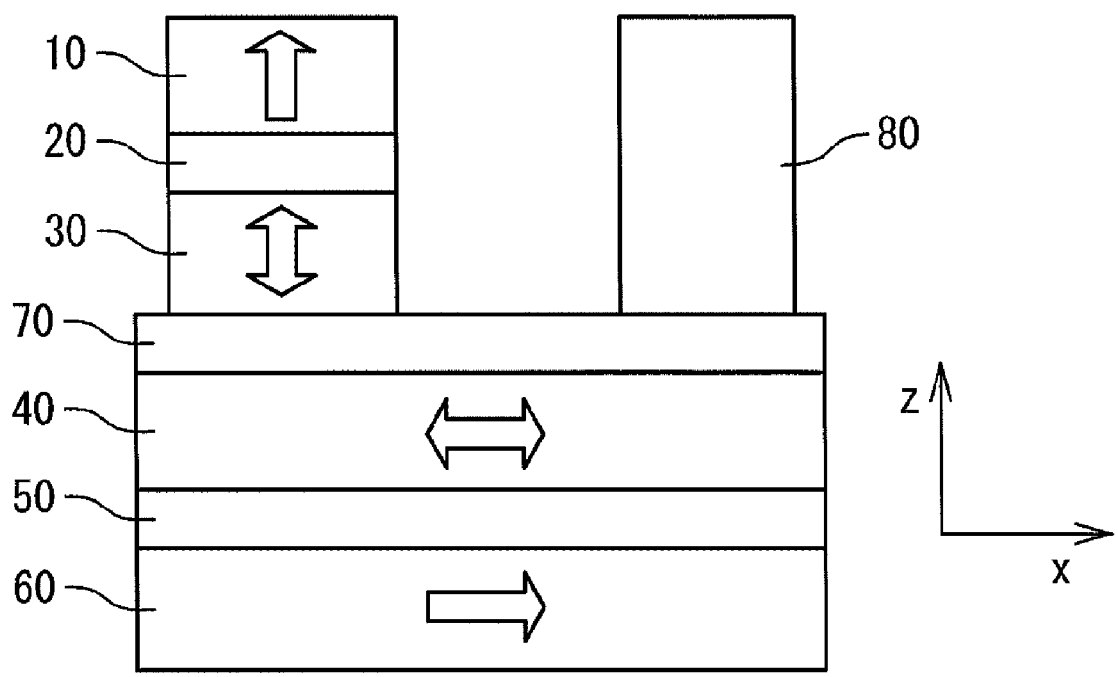
FIG. 11C is a x-z side view of the structure shown in FIG. 11A.

FIG. 11A is a perspective view showing another example of the structure of the magnetoresistance effect element 1. FIG. 11B and FIG. 11C respectively are a x-y plan view and a x-z side view of the structure shown in FIG. 11A. In the example shown in FIGS. 11A to 11C also, the write layer group is provided above the read layer group. Whereas, the second conductive layer 80 is provided on the write layer group side (upper side) of the first conductive layer 70.

Figure 12A:
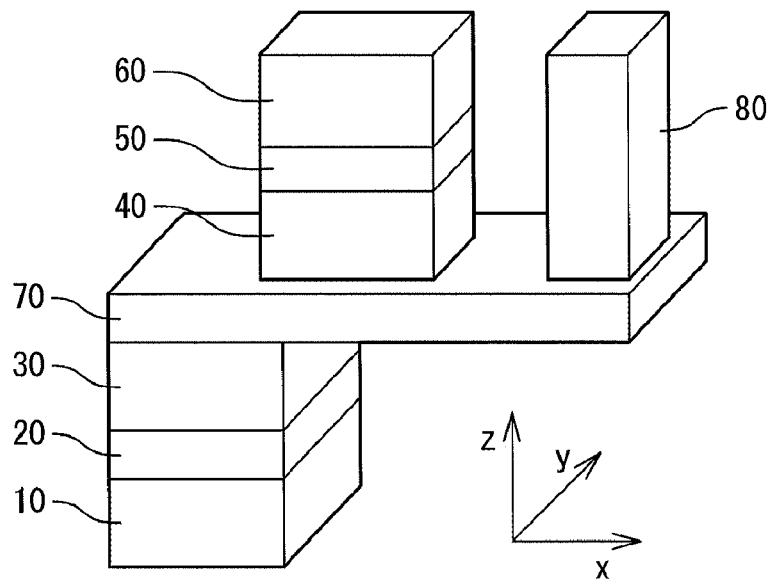
FIG. 12A is a perspective view showing still another example of the structure of the magnetoresistance effect element in the second modification example.
Figure 12B:
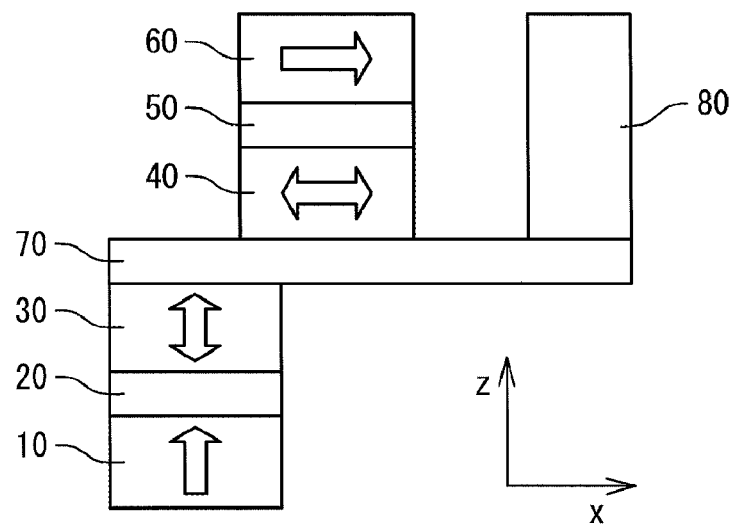
FIG. 12B is a x-z side view of the structure shown in FIG. 12A.

FIG. 12A is a perspective view showing still another example of the structure of the magnetoresistance effect element 1. FIG. 12B is a x-z side view of the structure shown in FIG. 12A. In the example shown in FIGS. 12A and 12B, the write layer group is provided below the read layer group. The second conductive layer 80 is provided on the read layer group side (upper side) of the first conductive layer 70.

In addition, various positional relationships of the write layer group, the read layer group and the plug group are possible. Note that, in order to enhance strength of the magnetic coupling between the first magnetization free layer 30 and the second magnetization free layer 40, it is desirable that a distance between the first magnetization free layer 30 and the second magnetization free layer 40 is small. It is therefore preferable that the first magnetization fixed layer 10, the first spacer layer 20, the first magnetization free layer 30, the first conductive layer 70, the second magnetization free layer 40, the second spacer layer 50 and the second magnetization fixed layer 60 are stacked in this order from the bottom or from the top, as described above. It should be noted that the first conductive layer 70 can be omitted as will be described later. Moreover, a combination of the second modification example and the first modification example also is possible.

Third Modification Example

A third modification example relates to a shape of each layer in the write layer group or in the read layer group. The first magnetization fixed layer 10 and the first magnetization free layer 30 in the write layer group do not necessarily have the same shape. Similarly, the second magnetization fixed layer 60 and the second magnetization free layer 40 in the read layer group do not necessarily have the same shape.

Figure 13A:
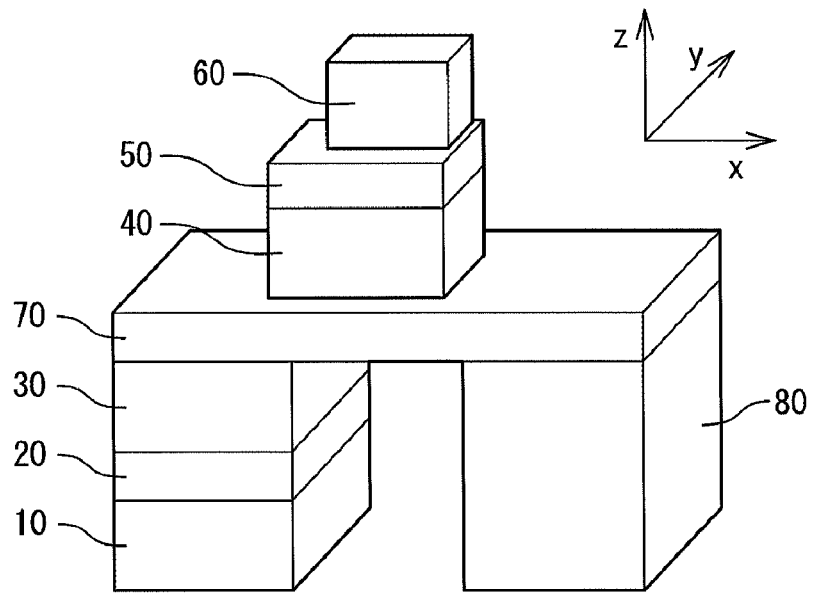
FIG. 13A is a perspective view showing an example of the structure of the magnetoresistance effect element in a third modification example.
Figure 13B:
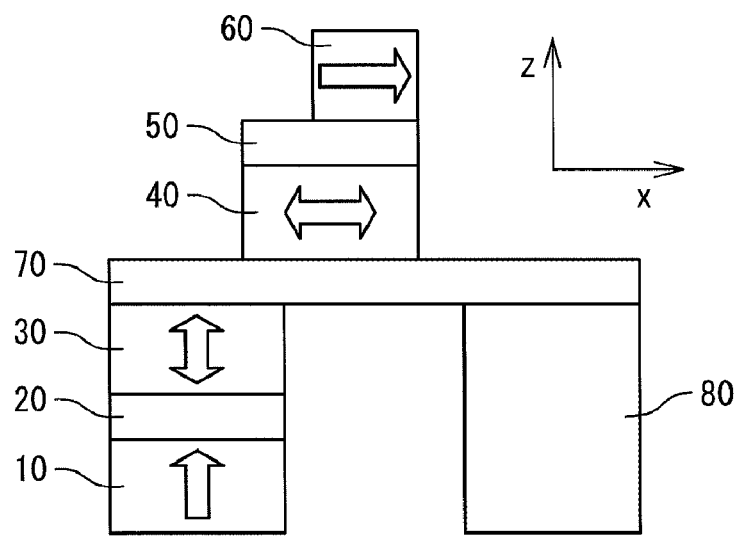
FIG. 13B is a x-z side view of the structure shown in FIG. 13A.

FIG. 13A is a perspective view showing an example of the structure of the magnetoresistance effect element 1. FIG. 13B is a x-z side view of the structure shown in FIG. 13A. In the example shown in FIGS. 13A and 13B, planar shapes of the second magnetization free layer 40 and the second magnetization fixed layer 60 in the read layer group are different from each other. More specifically, the second magnetization fixed layer 60 is so patterned as to be smaller than the second magnetization free layer 40. That is, in the x-y plane, an area of the second magnetization fixed layer 60 is smaller than an area of the second magnetization free layer 40.

In the data reading, as described above, the change in the resistance value of the read layer group due to the magnetoresistance effect is utilized. The magnetoresistance effect appears at a junction part (magnetic tunnel junction) of the second magnetization free layer 40 and the second magnetization fixed layer 60. In the case where the planar shape of the second magnetization fixed layer 60 is smaller than the planar shape of the second magnetization free layer 40 as shown in FIGS. 13A and 13B, the magnetic tunnel junction corresponds to a region overlapping with the second magnetization fixed layer 60. Meanwhile, there exists a section within the second magnetization free layer 40 where the rotation of the magnetization due to the leakage magnetic field from the first magnetization free layer 30 is remarkable. Therefore, by arranging the second magnetization fixed layer 60 so as to overlap only with the section within the second magnetization free layer 40, it is possible to maximize the MR ratio contributing to the magnitude of the read-out signal.

Figure 14A:
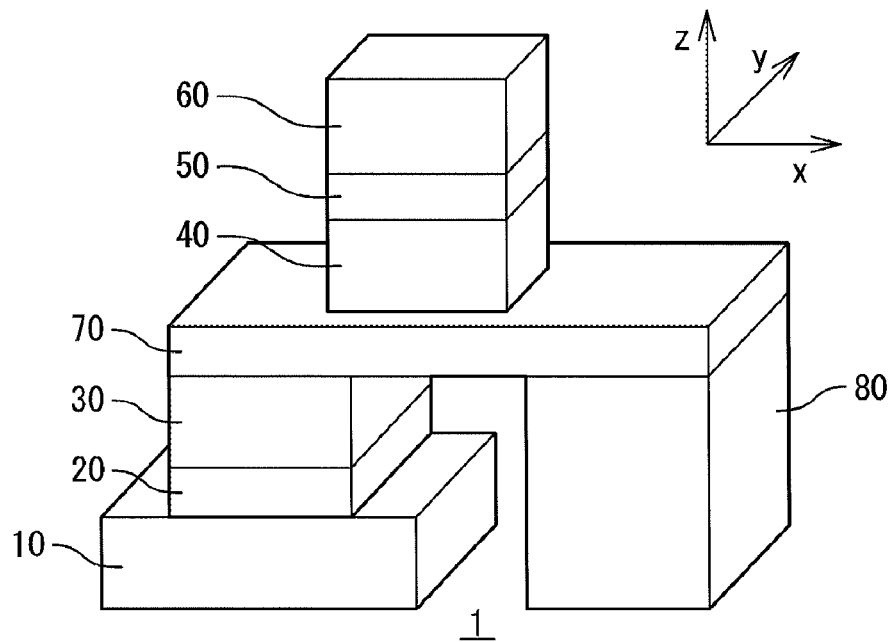
FIG. 14A is a perspective view showing another example of the structure of the magnetoresistance effect element in the third modification example.
Figure 14B:
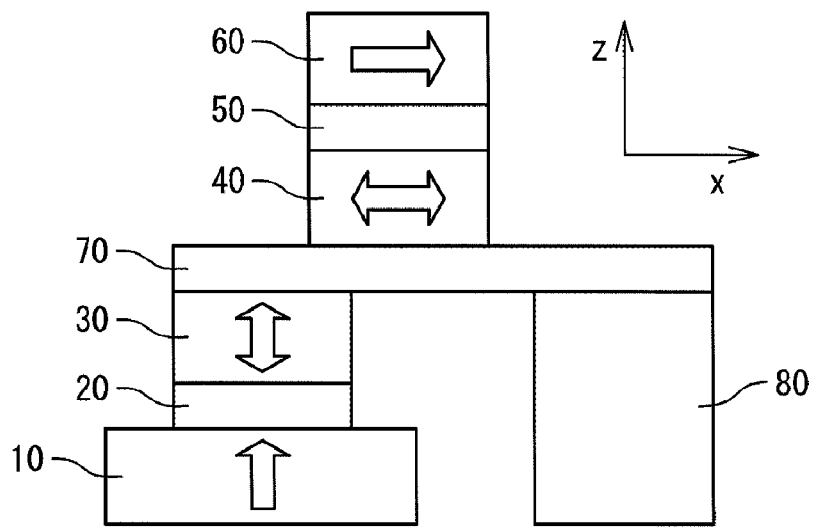
FIG. 14B is a x-z side view of the structure shown in FIG. 14A.

FIG. 14A is a perspective view showing another example of the structure of the magnetoresistance effect element 1. FIG. 14B is a x-z side view of the structure shown in FIG. 14A. In the example shown in FIGS. 14A and 14B, planar shapes of the first magnetization fixed layer 10 and the first magnetization free layer 30 in the write layer group are different from each other. More specifically, the first magnetization fixed layer 10 is so patterned as to be larger than the first magnetization free layer 30. That is, in the x-y plane, an area of the first magnetization fixed layer 10 is larger than an area of the first magnetization free layer 30.

In the data writing, as described above, the magnetization of the first magnetization free layer 30 is reversed by the spin transfer between the first magnetization fixed layer 10 and the first magnetization free layer 30. At this time, the magnetization of the first magnetization fixed layer 10 must be fixed substantially in one direction. If the magnetization fixation is weak, the magnetization of the first magnetization fixed layer 10 may be reversed due to the spin polarized electrons from the first magnetization free layer 30, which is a problem. In the case where the planar shape of the first magnetization fixed layer 10 is larger than the planar shape of the first magnetization free layer 30 as shown in FIGS. 14A and 14B, the write current density is lowered in the first magnetization fixed layer 10. It is thus possible to reduce probability of the magnetization reversal of the first magnetization fixed layer 10.

Respective planar shapes of the first magnetization fixed layer 10, the first magnetization free layer 30, the second magnetization free layer 40 and the second magnetization fixed layer 60 are not limited to rectangle and can be different from each other. Moreover, a combination of the structure shown in FIGS. 13A and 13B and the structure shown in FIGS. 14A and 14B also is possible. Furthermore, a combination of the third modification example and the foregoing modification example also is possible.

Fourth Modification Example

A fourth modification example relates to the number of write layer group. More specifically, the magnetoresistance effect element 1 according to the fourth modification example is provided with a plurality of write layer groups. Each of the plurality of write layer groups has the above-described first magnetization fixed layer 10, first spacer layer 20 and first magnetization free layer 30.

Figure 15A:
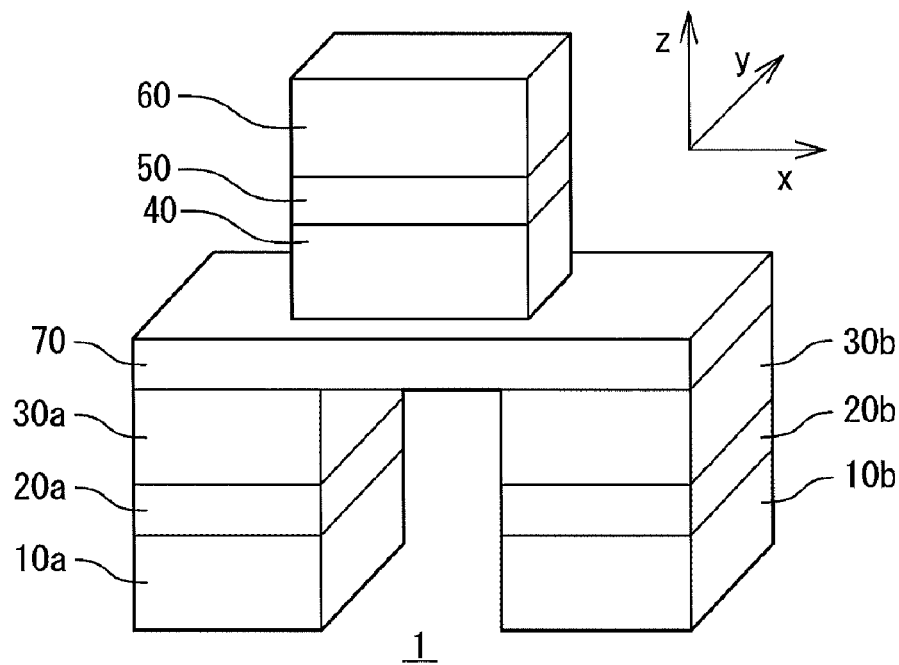
FIG. 15A is a perspective view showing an example of the structure of the magnetoresistance effect element in a fourth modification example.
Figure 15B:
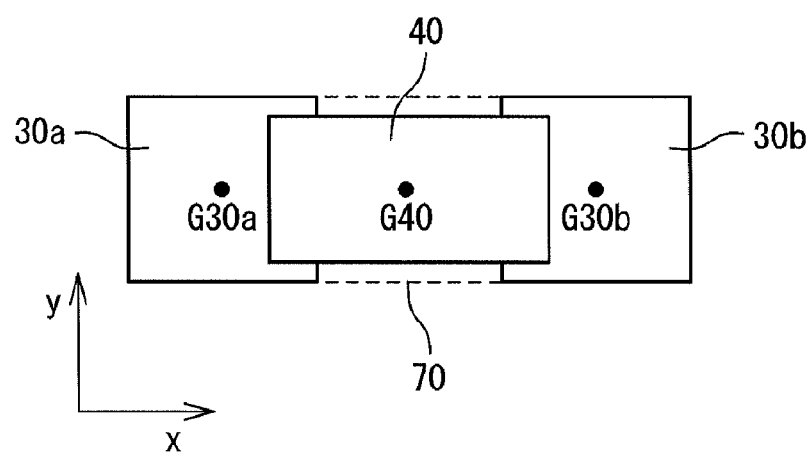
FIG. 15B is a x-y plan view of the structure shown in FIG. 15A.
Figure 15C:
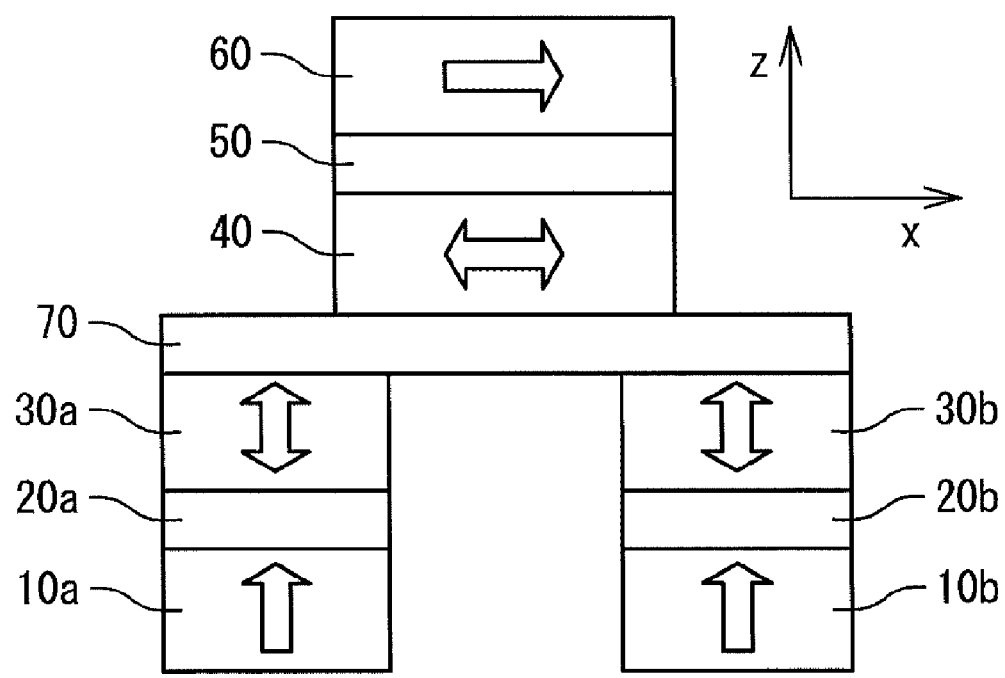
FIG. 15C is a x-z side view of the structure shown in FIG. 15A.

FIG. 15A is a perspective view showing an example of the structure of the magnetoresistance effect element 1. FIG. 15B and FIG. 15C respectively are a x-y plan view and a x-z side view of the structure shown in FIG. 15A. In the example shown in FIGS. 15A to 15C, the magnetoresistance effect element 1 has a first write layer group, a second write layer group, the first conductive layer 70 and the read layer group (40 to 60). The first write layer group has a first magnetization fixed layer 10a, a first spacer layer 20a and a first magnetization free layer 30a. The second write layer group has a first magnetization fixed layer 10b, a first spacer layer 20b and a first magnetization free layer 30b.

Preferably, the first magnetization fixed layer 10a and the first magnetization fixed layer 10b are formed in the same layer and have the same material, shape and film thickness. Also, the first spacer layer 20a and the first spacer layer 20b are formed in the same layer and have the same material, shape and film thickness. Also, the first magnetization free layer 30a and the first magnetization free layer 30b are formed in the same layer and have the same material, shape and film thickness. In the example shown in FIGS. 15A to 15C, the first magnetization free layer 30a and the first magnetization free layer 30b both are in contact with one surface of the first conductive layer 70, and the second magnetization free layer 40 is in contact with the other surface.

The first magnetization free layer 30a and the second magnetization free layer 40 are magnetically coupled to each other. Moreover, the center G40 of the second magnetization free layer 40 is displaced from the center G30a of the first magnetization free layer 30a in the x-y plane. Therefore, the magnetization of the first magnetization free layer 30a exerts magnetic force in the in-plane direction to the second magnetization free layer 40. Similarly, the first magnetization free layer 30b and the second magnetization free layer 40 are magnetically coupled to each other. Moreover, the center G40 of the second magnetization free layer 40 is displaced from the center G30b of the first magnetization free layer 30b in the x-y plane. Therefore, the magnetization of the first magnetization free layer 30b exerts magnetic force in the in-plane direction to the second magnetization free layer 40.

Preferably, the center G40 of the second magnetization free layer 40 is located between the center G30a of the first magnetization free layer 30a and the center G30b of the first magnetization free layer 30b in the x-y plane. It is particularly preferable that the center G30a of the first magnetization free layer 30a, the center G40 of the second magnetization free layer 40 and the center G30b of the first magnetization free layer 30b align in the x-y plane. In the example shown in FIGS. 15A to 15C, the center G40 of the second magnetization free layer 40 is displaced in the +x-direction from the center G30a of the first magnetization free layer 30a, and further the center G30b of the first magnetization free layer 30b is displaced in the +x-direction from the center G40 of the second magnetization free layer 40.

Figure 16A:
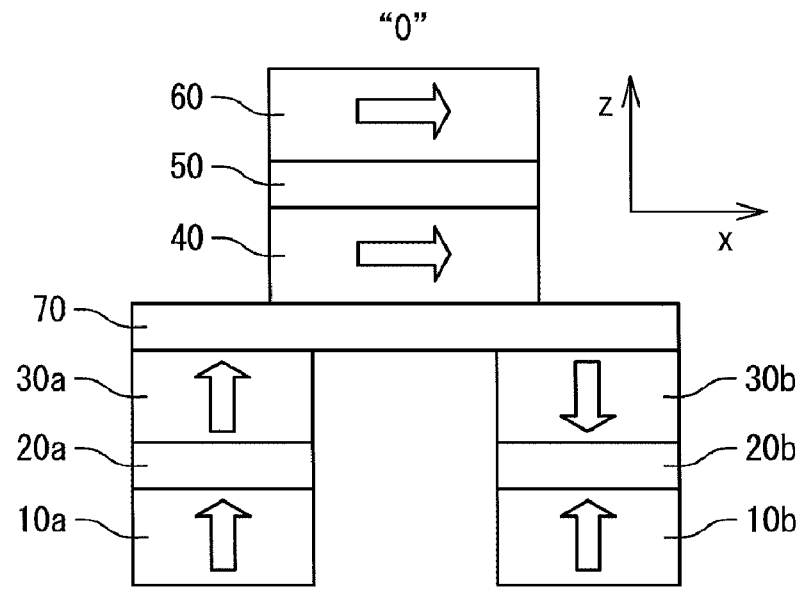
FIG. 16A is a x-z side view for explaining a memory state of the magnetoresistance effect element according to the fourth modification example.
Figure 16B:
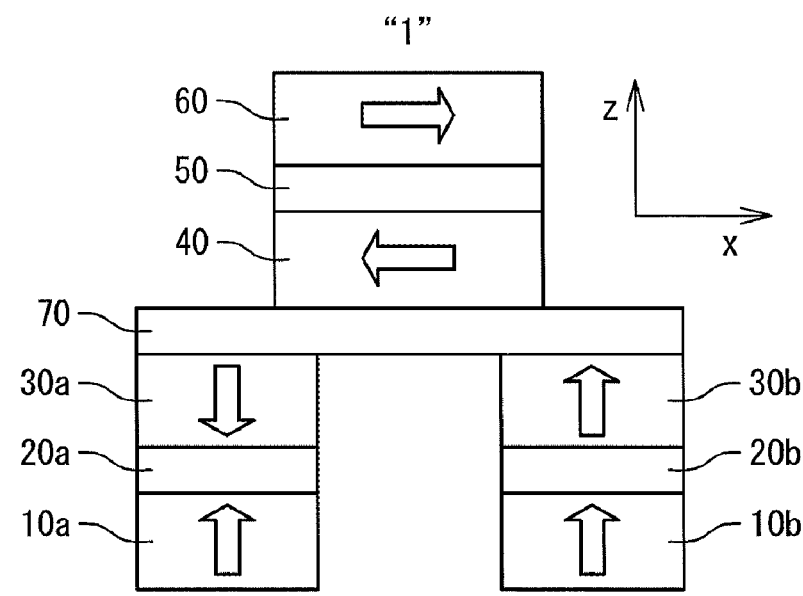
FIG. 16B is a x-z side view for explaining a memory state of the magnetoresistance effect element according to the fourth modification example.

FIG. 16A and FIG. 16B respectively show two memory states of the magnetoresistance effect element 1 shown in FIGS. 15A to 15C. In the example shown in FIG. 16A and FIG. 16B, the magnetization directions of the first magnetization fixed layers 10a and 10b are parallel to each other and are fixed in the same +z-direction. The magnetization direction of the second magnetization fixed layer 60 is fixed in the +x-direction.

In FIG. 16A, the magnetization of the first magnetization free layer 30a is directed to the +z-direction, while the magnetization of the first magnetization free layer 30b is directed to the −z-direction. That is, the magnetization directions of the first magnetization free layers 30a and 30b are substantially anti-parallel to each other. In this case, the leakage magnetic fields from the first magnetization free layers 30a and 30b both have the +x component at the position of the center G40 of the second magnetization free layer 40. The reason is that the center G40 of the second magnetization free layer 40 is located between the respective centers G30a and G30b of the first magnetization free layers 30a and 30b. In other words, since the center G40 is located between the centers G30a and G30b and the magnetization directions of the first magnetization free layers 30a and 30b are anti-parallel, the magnetic forces due to the first magnetization free layers 30a and 30b mutually strengthen each other at the position of the second magnetization free layer 40. The mutual magnetic force strengthening effect peaks when the centers G30a, G40 and G30b align, which is preferable. In this manner, the magnetization of the second magnetization free layer 40 has a component in the +x-direction due to the magnetic coupling between the first magnetization free layers 30a, 30b and the second magnetization free layer 40. In this case, the magnetization direction of the second magnetization free layer 40 has a component "parallel" to the magnetization direction of the second magnetization fixed layer 60, and thus the resistance value of the second magnetoresistance effect element becomes comparatively low (the "0" state).

In FIG. 16B, on the other hand, the magnetization of the first magnetization free layer 30a is directed to the −z-direction, while the magnetization of the first magnetization free layer 30b is directed to the +z-direction. In this case, the leakage magnetic fields from the first magnetization free layers 30a and 30b both have the −x component at the position of the center G40 of the second magnetization free layer 40. As a result, the magnetization of the second magnetization free layer 40 has a component in the −x-direction. In this case, the magnetization direction of the second magnetization free layer 40 has a component "anti-parallel" to the magnetization direction of the second magnetization fixed layer 60, and thus the resistance value of the second magnetoresistance effect element becomes comparatively high (the "1" state).

When the magnetization direction of one of the first magnetization free layers 30a and 30b is switched, the magnetization direction of the other thereof needs to be switched simultaneously. To that end, at the time of data writing, the write current Iwrite is supplied between the first magnetization fixed layer 10 and the first magnetization free layer 30 in each of the write layer groups. The directions of the write current Iwrite in the respective write layer groups are designed as appropriate such that the magnetizations of the respective first magnetization free layers 30 are switched.

Figure 17A:
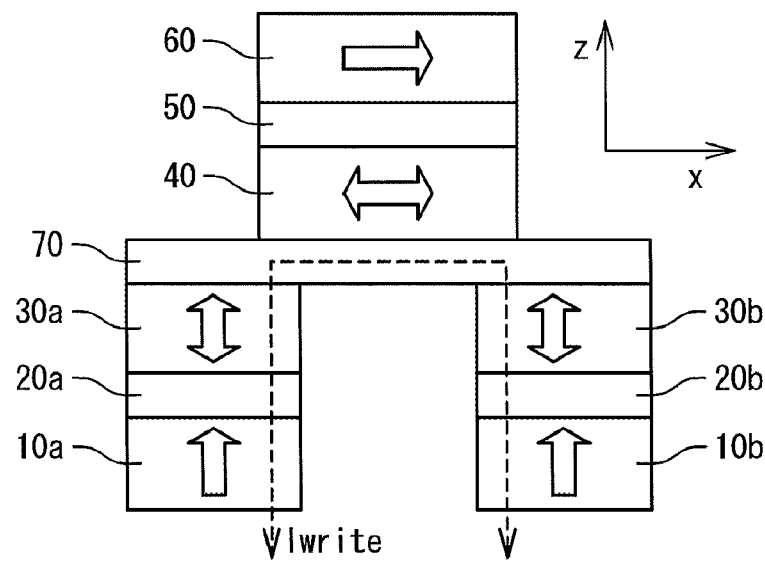
FIG. 17A is a conceptual diagram for explaining a method of writing a data to the magnetoresistance effect element according to the fourth modification example.

FIG. 17A shows an example of the write current Iwrite in the fourth modification example. As described above, the magnetization directions of the first magnetization fixed layers 10a and 10b are parallel to each other, and the magnetization directions of the first magnetization free layers 30a and 30b are anti-parallel to each other. Therefore, the direction of the write current Iwrite flowing between the first magnetization fixed layer 10a and the first magnetization free layer 30a of the first write layer group is designed opposite to the direction of the write current Iwrite flowing between the first magnetization fixed layer 10b and the first magnetization free layer 30b of the second write layer group. In other words, when the write current Iwrite flows from the first magnetization fixed layer 10 to the first magnetization free layer 30 in one write layer group, the write current Iwrite flows from the first magnetization free layer 30 to the first magnetization fixed layer 10 in the other write layer group. As a result, the anti-parallel magnetizations of the first magnetization free layers 30a and 30b both are switched. In the example shown in FIG. 17A, the write current Iwrite is supplied between the first write layer group and the second write layer group through the first conductive layer 70, and both of the "0"

writing and the "1" writing can be achieved by switching the direction of the write current Iwrite. However, a method of introducing the write current Iwrite is not limited to that.

Figure 17B:
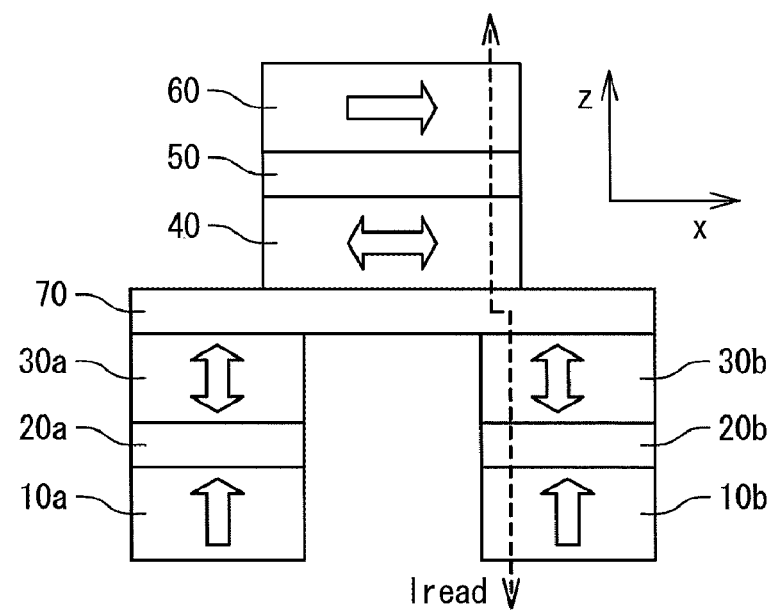
FIG. 17B is a conceptual diagram for explaining a method of reading a data from the magnetoresistance effect element according to the fourth modification example.

At the time of data reading, the read current Iread is supplied between the second magnetization free layer 40 and the second magnetization fixed layer 60 of the read layer group. A method of introducing the read current Iread to the read layer group can be designed as appropriate. FIG. 17B shows an example of the method of introducing the read current Iread. In the example shown in FIG. 17B, the read current tread is introduced through the second write layer group. The read current tread may be supplied through the first write layer group or through both of the first write layer group and the second write layer group.

The fourth modification example can be combined with the foregoing modification example. According to the fourth modification example, the following effects can be obtained additionally.

First, the read-out signal is further enhanced. In the present modification example, two or more first magnetization free layers 30 which are sources of the leakage magnetic field contributing to rotation of the magnetization of the second magnetization free layer 40 are provided. Therefore, the magnitude of the magnetic field acting on the second magnetization free layer 40 becomes twice or more, resulting in larger rotation of the magnetization of the second magnetization free layer 40. Consequently, the magnetoresistance effect becomes more remarkable, and thus a large read-out signal can be obtained.

Moreover, manufacturing processes are simplified. In the case of the structure shown in the foregoing FIGS. 1A to 1C, for example, the write layer group (10 to 30) and the second conductive layer 80 are arranged in the same layer and need to be manufactured by separate processes. According to the present modification example, on the other hand, the first write layer group and the second write layer group can be manufactured by the same process. Therefore, the number of manufacturing processes is reduced and the manufacturing costs are reduced.

Fifth Modification Example

In a fifth modification example, the first conductive layer 70 is omitted. The fifth modification example can be combined with the foregoing modification example.

Figure 18A:
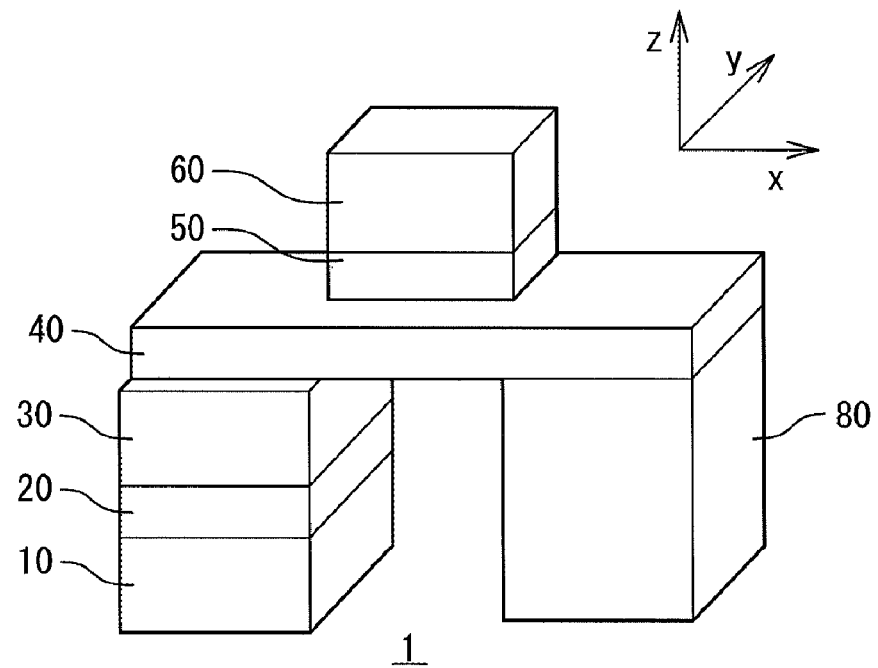
FIG. 18A is a perspective view showing an example of the structure of the magnetoresistance effect element in a fifth modification example.
Figure 18B:
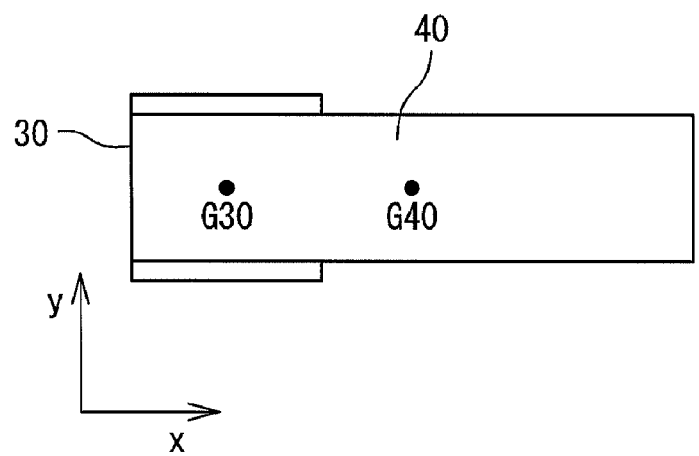
FIG. 18B is a x-y plan view of the structure shown in FIG. 18A.

FIG. 18A is a perspective view showing an example of the structure of the magnetoresistance effect element 1. FIG. 18B and FIG. 18C respectively are a x-y plan view and a x-z side view of the structure shown in FIG. 18A. As shown in FIGS. 18A to 18C, the first conductive layer 70 is omitted, and the second magnetization free layer 40 is so provided as to be in contact with one surface of the first magnetization free layer 30. In this case also, the first magnetization free layer 30 and the second magnetization free layer 40 are magnetically coupled to each other, and the center G40 of the second magnetization free layer 40 is displaced from the center G30 of the first magnetization free layer 30. Therefore, the magnetization direction of the second magnetization free layer 40 is uniquely determined depending on the magnetization direction of the first magnetization free layer 30.

Moreover, in the example shown in FIGS. 18A to 18C, the second conductive layer 80 is electrically connected to the second magnetization free layer 40. At the time of data writing, the write current Iwrite can be introduced to the write layer group by using the second conductive layer 80 and the second magnetization free layer 40. At the time of data reading, the read current Iread can be introduced to the read layer group by using the second conductive layer 80.

Sixth Modification Example

Figure 19A:
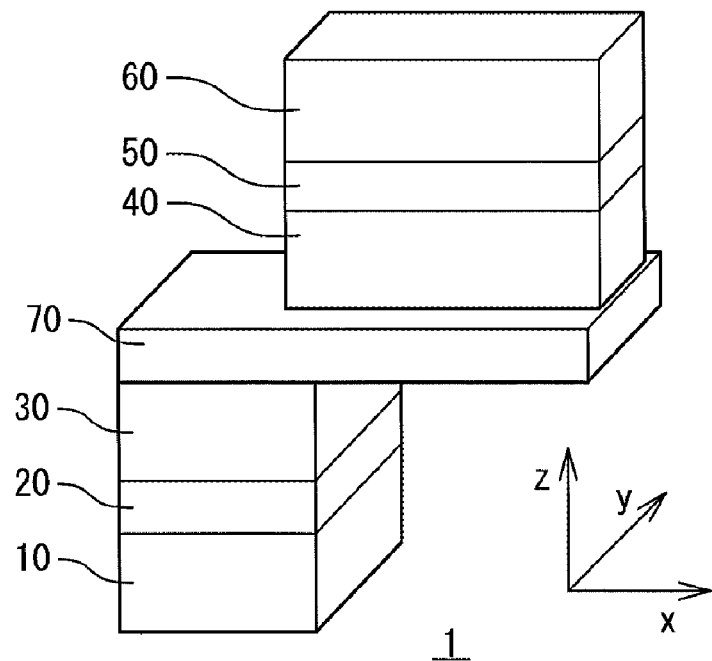
FIG. 19A is a perspective view showing an example of the structure of the magnetoresistance effect element in a sixth modification example.
Figure 19B:
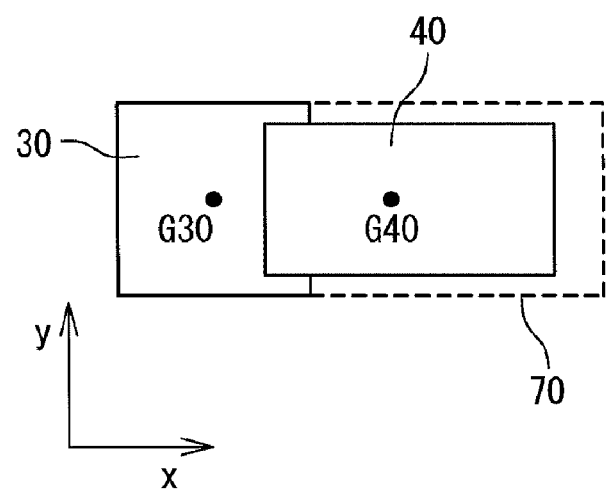
FIG. 19B is a x-y plan view of the structure shown in FIG. 19A.
Figure 19C:
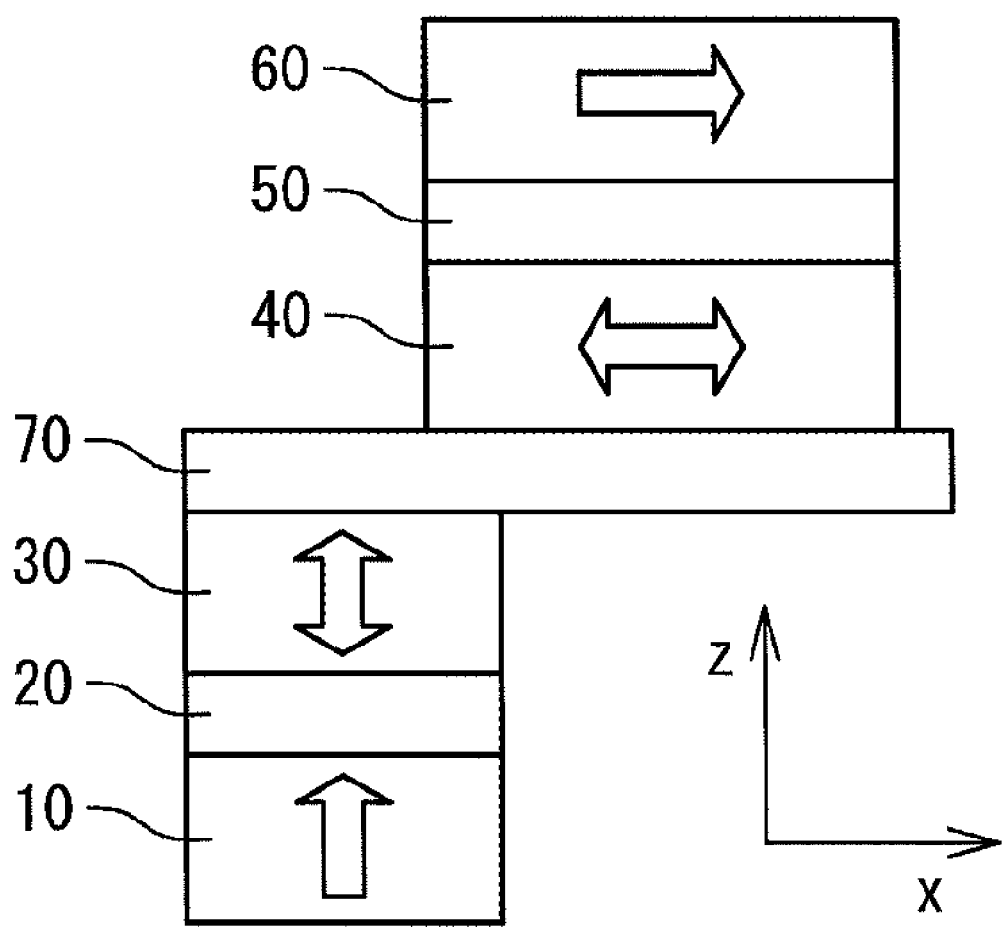
FIG. 19C is a x-z side view of the structure shown in FIG. 19A.

In a sixth modification example, the second conductive layer 80 is omitted. FIG. 19A is a perspective view showing an example of the structure of the magnetoresistance effect element 1. FIG. 19B and FIG. 19C respectively are a x-y plan view and a x-z side view of the structure shown in FIG. 19A. As shown in FIGS. 19A to 19C, the second conductive layer 80 is omitted, and the magnetoresistance effect element 1 is a two-terminal element. In this case also, the first magnetization free layer 30 and the second magnetization free layer 40 are magnetically coupled to each other, and the center G40 of the second magnetization free layer 40 is displaced from the center G30 of the first magnetization free layer 30. Therefore, the magnetization direction of the second magnetization free layer 40 is uniquely determined depending on the magnetization direction of the first magnetization free layer 30.

Figure 20A:
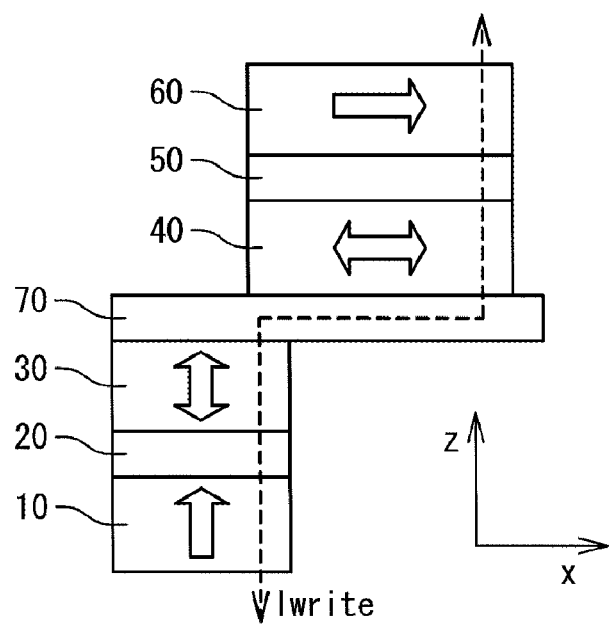
FIG. 20A is a conceptual diagram for explaining a method of writing a data to the magnetoresistance effect element according to the sixth modification example.
Figure 20B:
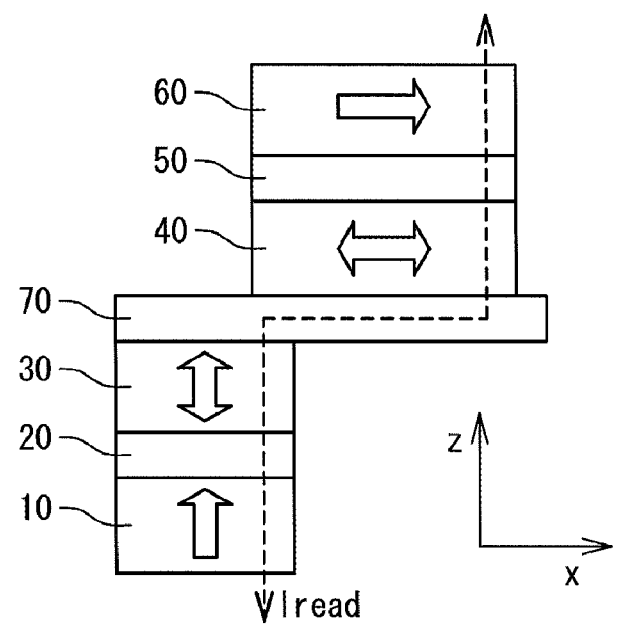
FIG. 20B is a conceptual diagram for explaining a method of reading a data from the magnetoresistance effect element according to the sixth modification example.

FIG. 20A and FIG. 20B respectively show paths of the write current Iwrite and the read current Iread in the present modification example. Since the magnetoresistance effect element 1 according to the present modification example is a two-terminal element, the write current Iwrite introduced to the write layer group at the time of data writing flows in the read layer group as well. Similarly, the read current Iread introduced to the read layer group at the time of data reading flows in the write layer group as well. That is to say, the path of the write current Iwrite and the path of the read current Iread are the same.

It is therefore necessary to prevent at the time of data reading that the spin transfer magnetization switching is caused by the read current Iread in the first magnetization free layer 30. To that end, the read current Iread is set to small. Moreover, it is necessary to prevent at the time of data writing that the spin transfer magnetization switching is caused by the write current Iwrite in the second magnetization free layer 40. To that end, it is preferable that the current density of the write current Iwrite flowing in the read layer group (40, 50, 60) is lower than the current density of the write current Iwrite flowing in the write layer group (10, 20, 30). For example, an area of the read layer group in the x-y plane is designed to be larger than an area of the write layer group in the x-y plane.

According to the sixth modification example, the magnetoresistance effect element 1 is the two-terminal element, and thus one transistor just needs to be provided with respect to each magnetic memory cell. The transistor is connected to any one of the first magnetization fixed layer 10 and the second magnetization fixed layer 60. For example, the transistor TRb and the bit line BLb can be omitted from the circuit configuration shown in FIG. 5. As a result, an area of the magnetic memory cell can be reduced. The sixth modification example can be combined with any of the first to third and fifth modification examples.

Besides the above-described modification examples, various modification examples can be considered. For example, material having exothermal effect may be inserted to the write current path. In this case, element temperature is increased due to heat, and thermal assist recording effect can be obtained at the time of data writing. It is also possible that an interconnection is arranged in the vicinity of the magnetoresistance effect element and a magnetic field induced by a current flowing through the interconnection is used as an assist magnetic field for the spin transfer magnetization switching.

(MRAM)

Figure 21:
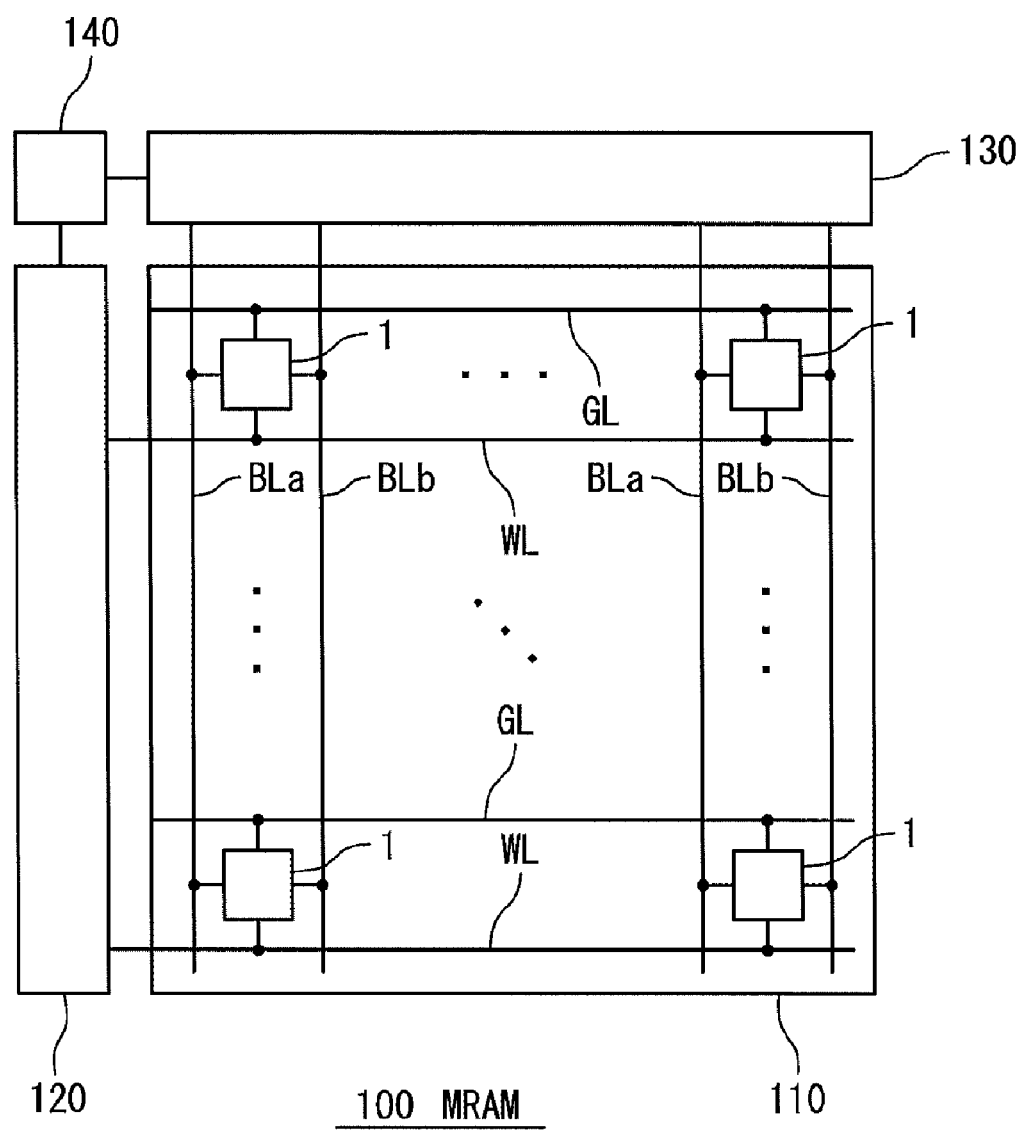
FIG. 21 is a block diagram showing an example of a configuration of a magnetic random access memory according to the exemplary embodiment of the present invention.

FIG. 21 is a block diagram showing an example of a configuration of the MRAM according to the exemplary embodiment of the present invention. The MRAM 100 is provided with a memory cell array 110, an X driver 120, a Y driver 130 and a controller 140. The memory cell array 110 has a plurality of magnetic memory cells that are arranged in an array form. Each of the magnetic memory cells has the above-described magnetoresistance effect element 1. As shown in the foregoing FIG. 5, each magnetic memory cell is connected to the word line WL, the ground line GL and the bit line pair BLa, BLb. The X driver 120 is connected to a plurality of word lines WL and drives a selected word line among the plurality of word lines WL that is connected to an access-target magnetic memory cell. The Y driver 130 is connected to a plurality of bit line pairs BLa, BLb and sets each bit line to the state corresponding to the data writing or the data reading. The controller 140 controls the X driver 120 and the Y driver 130 corresponding to the data writing or the data reading.

The MRAM 100 according to the present exemplary embodiment is applied, for example, to a nonvolatile memory installed in such devices as a cell phone, a mobile personal computer and a PDA or to a microcomputer with a built-in nonvolatile memory which is installed in an automobile and the like.

While the exemplary embodiments of the present invention have been described above with reference to the attached drawings, the present invention is not limited to these exemplary embodiments and can be modified as appropriate by those skilled in the art without departing from the spirit and scope of the present invention.

This application is the National Phase of PCT/JP2008/064891, filed on Aug. 21, 2008, which is based upon and claims the benefit of priority from Japanese patent application No. 2007-277519, filed on Oct. 25, 2007, the disclosure of which is incorporated herein in its entirely by reference.

The invention claimed is:

1. A magnetoresistance effect element comprising:
   a first magnetization fixed layer whose magnetization direction is fixed;
   a first magnetization free layer whose magnetization direction is variable;
   a first nonmagnetic layer sandwiched between said first magnetization fixed layer and said first magnetization free layer;
   a second magnetization fixed layer whose magnetization direction is fixed;
   a second magnetization free layer whose magnetization direction is variable; and,
   a second nonmagnetic layer sandwiched between said second magnetization fixed layer and said second magnetization free layer,
   wherein said first magnetization fixed layer and said first magnetization free layer have perpendicular magnetic anisotropy,
   said second magnetization fixed layer and said second magnetization free layer have in-plane magnetic anisotropy,
   said first magnetization free layer and said second magnetization free layer are magnetically coupled to each other, and
   center of said second magnetization free layer is displaced from center of said first magnetization free layer in a first plane parallel to each layer.

2. The magnetoresistance effect element according to claim 1, wherein a write current flows between said first magnetization free layer and said first magnetization fixed layer at a time of data writing, and
   a read current flows between said second magnetization free layer and said second magnetization fixed layer at a time of data reading.

3. The magnetoresistance effect element according to claim 1, wherein the magnetization direction of said second magnetization fixed layer is substantially parallel to or substantially anti-parallel to a displacement direction of the center between said first magnetization free layer and said second magnetization free layer.

4. The magnetoresistance effect element according to claim 1, wherein in said first plane, an area of said first magnetization fixed layer is larger than an area of said first magnetization free layer.

5. The magnetoresistance effect element according to claim 1, wherein in said first plane, an area of said second magnetization fixed layer is smaller than an area of said second magnetization free layer.

6. The magnetoresistance effect element according to claim 1, further comprising: a first conductive layer sandwiched between said first magnetization free layer and said second magnetization free layer.

7. The magnetoresistance effect element according to claim 6, wherein said first conductive layer is formed of magnetic material.

8. The magnetoresistance effect element according to claim 1, wherein said second magnetization free layer is in contact with one surface of said first magnetization free layer.

9. The magnetoresistance effect element according to claim 8, further comprising a second conductive layer electrically connected to said second magnetization free layer.

10. The magnetoresistance effect element according to claim 1, wherein a write current flows between said first magnetization free layer and said first magnetization fixed layer at a time of data writing, and said write current further flows between said second magnetization free layer and said second magnetization fixed layer.

11. The magnetoresistance effect element according to claim 10, wherein current density of said write current flowing between said second magnetization free layer and said second magnetization fixed layer is lower than current density of said write current flowing between said first magnetization free layer and said first magnetization fixed layer.

12. The magnetoresistance effect element according to claim 1, comprising: a plurality of write layer groups, wherein each of said plurality of write layer groups comprises said first magnetization fixed layer, said first magnetization free layer and said first nonmagnetic layer.

13. The magnetoresistance effect element according to claim 12, wherein
   said plurality of write layer groups include a first write layer group and a second write layer group, and
   wherein in said first plane, the center of said second magnetization free layer is located between the center of said first magnetization free layer of said first write layer group and the center of said first magnetization free layer of said second write layer group.

14. The magnetoresistance effect element according to claim 13, wherein in said first plane, the center of said first magnetization free layer of said first write layer group, the center of said second magnetization free layer and the center of said first magnetization free layer of said second write layer group align.

15. The magnetoresistance effect element according to claim 13, wherein the magnetization direction of said first magnetization free layer of said first write layer group is anti-parallel to the magnetization direction of said first magnetization free layer of said second write layer group.

16. The magnetoresistance effect element according to claim 15, wherein the magnetization direction of said first magnetization fixed layer of said first write layer group is parallel to the magnetization direction of said first magnetization fixed layer of said second write layer group.

17. The magnetoresistance effect element according to claim 16,
wherein a write current flows between said first magnetization free layer and said first magnetization fixed layer in each of said first write layer group and said second write layer group at a time of data writing, and
a direction of said write current flowing in said first write layer group is opposite to a direction of said write current flowing in said second write layer group.

18. The magnetoresistance effect element according to claim 1, wherein said second nonmagnetic layer includes Mg—O.

19. The magnetoresistance effect element according to claim 1, wherein at least one of said second magnetization free layer and said second magnetization fixed layer includes Co—Fe—B.

20. A magnetic random access memory comprising a plurality of magnetic memory cells arranged in an array form, each of said plurality of magnetic memory cells comprising the magnetoresistance effect element according to claim 1.

* * * * *